United States Patent
Torazawa et al.

(10) Patent No.: US 11,952,213 B2
(45) Date of Patent: Apr. 9, 2024

(54) CEILING SUSPENDED SHELF

(71) Applicant: MURATA MACHINERY, LTD., Kyoto (JP)

(72) Inventors: Masayoshi Torazawa, Inuyama (JP); Masataka Hayashi, Inuyama (JP)

(73) Assignee: MURATA MACHINERY, LTD., Kyoto (JP)

( * ) Notice: Subject to any disclaimer, the term of this patent is extended or adjusted under 35 U.S.C. 154(b) by 483 days.

(21) Appl. No.: 17/289,790

(22) PCT Filed: Sep. 30, 2019

(86) PCT No.: PCT/JP2019/038475
§ 371 (c)(1),
(2) Date: Apr. 29, 2021

(87) PCT Pub. No.: WO2020/095571
PCT Pub. Date: May 14, 2020

(65) Prior Publication Data
US 2021/0347567 A1    Nov. 11, 2021

(30) Foreign Application Priority Data

Nov. 6, 2018 (JP) .................. 2018-208652

(51) Int. Cl.
*B65G 1/04* (2006.01)
*B61B 3/00* (2006.01)
*H01L 21/677* (2006.01)

(52) U.S. Cl.
CPC .............. *B65G 1/0457* (2013.01); *B61B 3/00* (2013.01); *B65G 2201/0297* (2013.01); *H01L 21/67733* (2013.01)

(58) Field of Classification Search
CPC .......... B65G 1/0457; B65G 2201/0297; B61B 3/00; H01L 21/67733
See application file for complete search history.

(56) References Cited

U.S. PATENT DOCUMENTS

| | | | |
|---|---|---|---|
| 7,578,650 B2* | 8/2009 | Aalund | H01L 21/67775 414/217 |
| 11,876,009 B2* | 1/2024 | Torazawa | H01L 21/6773 |
| 2007/0081879 A1 | 4/2007 | Bonora et al. | |
| 2007/0092359 A1 | 4/2007 | Pickreign et al. | |

(Continued)

FOREIGN PATENT DOCUMENTS

| | | |
|---|---|---|
| JP | 2011-148613 A | 8/2011 |
| JP | 2017-030944 A | 2/2017 |

(Continued)

OTHER PUBLICATIONS

Official Communication issued in corresponding European Patent Application No. 19881592.0, dated May 17, 2022.

*Primary Examiner* — Gerald McClain
(74) *Attorney, Agent, or Firm* — Keating & Bennett, LLP

(57) ABSTRACT

An overhead transport vehicle temporarily places a FOUP at a ceiling suspended shelf while transporting the FOUP to a target position by traveling along a rail on a ceiling of a building from which the ceiling suspended is suspended. The ceiling suspended shelf includes an upper shelf including an upper support surface that supports the FOUP. A level of the upper support surface is the same or substantially the same as a level of the rail.

14 Claims, 18 Drawing Sheets

(56) References Cited

U.S. PATENT DOCUMENTS

| | | | |
|---|---|---|---|
| 2008/0014061 A1 | 1/2008 | Izumi | |
| 2014/0003902 A1 | 1/2014 | Inui et al. | |
| 2015/0110585 A1* | 4/2015 | Ota | H01L 21/67766 414/222.13 |
| 2016/0329225 A1 | 11/2016 | Bachlechner et al. | |
| 2019/0019707 A1* | 1/2019 | Suzuki | B25J 9/104 |
| 2021/0043487 A1* | 2/2021 | Goto | H01L 21/67724 |
| 2021/0398835 A1* | 12/2021 | Torazawa | B65G 47/61 |

FOREIGN PATENT DOCUMENTS

| | | | | |
|---|---|---|---|---|
| WO | WO-2017150005 A1 * | 9/2017 | | B25J 5/007 |
| WO | WO-2020095570 A1 * | 5/2020 | | B61B 3/02 |

* cited by examiner

CEILING SUSPENDED SHELF

BACKGROUND OF THE INVENTION

1. Field of the Invention

The present invention relates to a ceiling suspended shelf where an overhead transport vehicle temporarily places articles.

2. Description of the Related Art

Conventionally, an overhead transport vehicle for transporting articles along a rail disposed on a ceiling is used in, for example, a factory for manufacturing semiconductor products. The factory sometimes has a shelf where articles transported by the overhead transport vehicle are temporarily stored. A transport system including the overhead transport vehicle and shelf as mentioned above is disclosed in Japanese Patent Application Laid-Open No. 2017-30944.

The overhead transport vehicle according to Japanese Patent Application Laid-Open No. 2017-30944 includes an elevator device for lowering articles and a lateral transfer device for laterally moving articles. Japanese Patent Application Laid-Open No. 2017-30944 has a plurality of shelves, which are supported by poles and are arranged one above another. The overhead transport vehicle is capable of lowering articles to a predetermined height of the shelf with the elevator device, and then laterally moving the articles, to place the articles in the shelf.

In a factory for manufacturing semiconductor products like the one shown in Japanese Patent Application Laid-Open No. 2017-30944, as the processing speed of a processing apparatus increases, a capacity for storing additional articles may be required. Not only factories for manufacturing semiconductor products but also various buildings where overhead transport vehicles are disposed may be required to have a configuration capable of storing additional articles, too.

SUMMARY OF THE INVENTION

Preferred embodiments of the present invention provide ceiling suspended shelves that are each able to place articles at a position where articles could not be placed conventionally.

The problem to be solved by the preferred embodiments of the present invention is as stated above. In the following, solutions to the problem as well as advantageous effects thereof will be described.

A preferred embodiment of the present invention provides a ceiling suspended shelf configured as follows. The ceiling suspended shelf, being suspended from the ceiling, is a shelf where an overhead transport vehicle temporarily places articles to be transported to a target position. The overhead transport vehicle travels along the rail suspended from the ceiling, and transports the articles. The ceiling suspended shelf includes an upper shelf including an upper support surface that supports the articles. A level of the upper support surface is the same or substantially the same as a level of the rail.

Accordingly, the articles are able to be placed at a high position in a space that has conventionally not been available to place articles, thus providing more effective use of a space in the building.

In the ceiling suspended shelf, the upper shelf may include a switching mechanism to switch the state of the upper shelf between an open state that allows the articles to pass from below to above the upper shelf and a closed state that allows the upper shelf to support the articles and does not allow the articles to pass from below to above the upper shelf.

Accordingly, an operation to place the articles in the upper shelf, which locates the articles at a high position, is able to be implemented from below. Thus, the operation to place the articles is able to be simple.

In the ceiling suspended shelf, the switching mechanism may switch between the open state and the closed state in response to receiving an external driving force.

Accordingly, the cost of the ceiling suspended shelf is able to be reduced, as compared to a drive source being provided for each ceiling suspended shelf.

The ceiling suspended shelf may be provided as follows. The upper shelf includes a first shaft, a first support portion, a second shaft, and a second support portion. The first shaft is able to rotate. The first support portion rotates integrally with the first shaft. The second shaft is able to rotate, and has its axial center different to that of the first shaft. The second support portion rotates integrally with the second shaft. The switching mechanism switches between the open state and the closed state by transmitting to the first shaft an external driving force as a rotational force while transmitting to the second shaft the external driving force as a rotational force in the direction reverse to the rotational force transmitted to the first shaft.

Accordingly, it is not necessary to independently drive the first shaft and the second shaft, which simplifies a drive system. If the first shaft and the second shaft were rotated in the same direction, the first support portion would be rotated upward while the second support portion would be rotated downward, resulting in a larger space occupied in the up-down direction of the upper shelf at a time of the state switching. In this respect, rotating the first shaft and the second shaft in different directions causes the first support portion and the second support portion to move up or down in the same direction, which contributes to a reduction of an occupied space in the up-down direction.

The ceiling suspended shelf may be provided as follows. The switching mechanism includes a coupling link mechanism that couples the first shaft to the second shaft. The coupling link mechanism includes a first coupling link and a second coupling link. The first coupling link is positioned on the side close to the first shaft. The second coupling link is positioned on the side close to the second shaft, is coupled to the first coupling link, and rotates in the direction reverse to a rotation direction of the first coupling link.

Accordingly, by using the links, the first shaft and the second shaft are able to be rotated in different directions.

The ceiling suspended shelf may be provided as follows. The switching mechanism includes a first shaft link, a second shaft link, and a coupling link. The first shaft link rotates integrally with the first shaft. The second shaft link rotates integrally with the second shaft. The coupling link couples the first shaft link to the second shaft link and the first shaft link and the second shaft link rotate in different directions.

Accordingly, by mainly using the single coupling link, the first shaft and the second shaft are able to be rotated in different directions, thus providing a simple mechanism.

The ceiling suspended shelf may be provided as follows. The switching mechanism includes a first pulley, a first belt, a first gear, a second gear, a second pulley, and a second belt. The first belt is wound around the first pulley, and rotates the first shaft. The first gear rotates integrally with the first pulley in the same direction as the first pulley. The second gear is meshed with the first gear directly or via an even number of gears, to thereby be rotated in the direction reverse to a rotation direction of the first gear. The second pulley rotates integrally with the second gear in the same direction as the second gear. The second belt is wound around the second pulley, and rotates the second shaft.

Accordingly, by using the belts and pulleys, the first shaft and the second shaft are able to be rotated in different directions.

The ceiling suspended shelf may be provided as follows. The switching mechanism includes a coupling belt, a first reel, and a second reel. The first reel rotates integrally with the first shaft, the first reel including the coupling belt wound thereon. The second reel rotates integrally with the second shaft, the second reel including the coupling belt wound thereon in the same winding direction as on the first reel. As the first reel is rotated by an external driving force and the coupling belt is wound onto the first reel, the second reel is rotated in the direction reverse to a rotation direction of the first reel. As the second reel is rotated by an external driving force and the coupling belt is wound onto the second reel, the first reel is rotated in the direction reverse to a rotation direction of the second reel.

Therefore, the belt may not be looped. Accordingly, a short belt is able to be used to rotate the first shaft and the second shaft in different directions.

The ceiling suspended shelf may be provided as follows. The ceiling suspended shelf further includes a lower shelf in addition to the upper shelf, the lower shelf overlapping the upper shelf in a plan view. The lower shelf is located lower than the upper shelf. The lower shelf does not allow the articles to pass therethrough in an up-down direction.

Since the shelves are able to be provided one above the other, the space in the building is able to be used more effectively.

In the ceiling suspended shelf, the number of the articles that are able to be placed in one compartment may be smaller in the upper shelf than in the lower shelf.

Accordingly, articles are able to be placed efficiently based on, for example, a difference in how each article is transported.

The ceiling suspended shelf may be provided as follows. The article is a wafer transport container to transport wafers. The upper shelf includes, on the upper support surface, an insertion pin that is able to be received in a recess formed in a bottom surface of the wafer transport container.

Accordingly, the presence of the insertion pin in the upper shelf is able to stabilize the posture of the wafer transport container.

The ceiling suspended shelf may be provided as follows. The target position is a position where the wafer transport container is placed toward a processing apparatus to process the wafers. The upper shelf is located at a position higher than the target position.

Accordingly, a space located higher than a load port is able to be used effectively.

In the ceiling suspended shelf, the upper shelf may include upper shelves that are located on opposite sides across the rail.

Accordingly, the space in the building is able to be used further effectively.

The ceiling suspended shelf may be provided as follows. The ceiling suspended shelf includes an upper side surface guide that faces a side surface of the article supported by the upper shelf. The upper side surface guide is located at a position higher than the lower end of the rail.

Accordingly, the upper shelf is able to be provided at a relatively high position.

The ceiling suspended shelf may include, on a back side the ceiling suspended shelf, an anti-drop structure that prevents the articles from dropping, where the back side is the side opposite to a front side facing the rail.

Accordingly, dropping of the articles is able to be prevented more reliably when, for example, the articles are transferred to the ceiling suspended shelf.

The above and other elements, features, steps, characteristics, and advantages of the present invention will become more apparent from the following detailed description of the preferred embodiments with reference to the attached drawings.

DETAILED DESCRIPTION OF THE PREFERRED EMBODIMENTS

Figure 1:
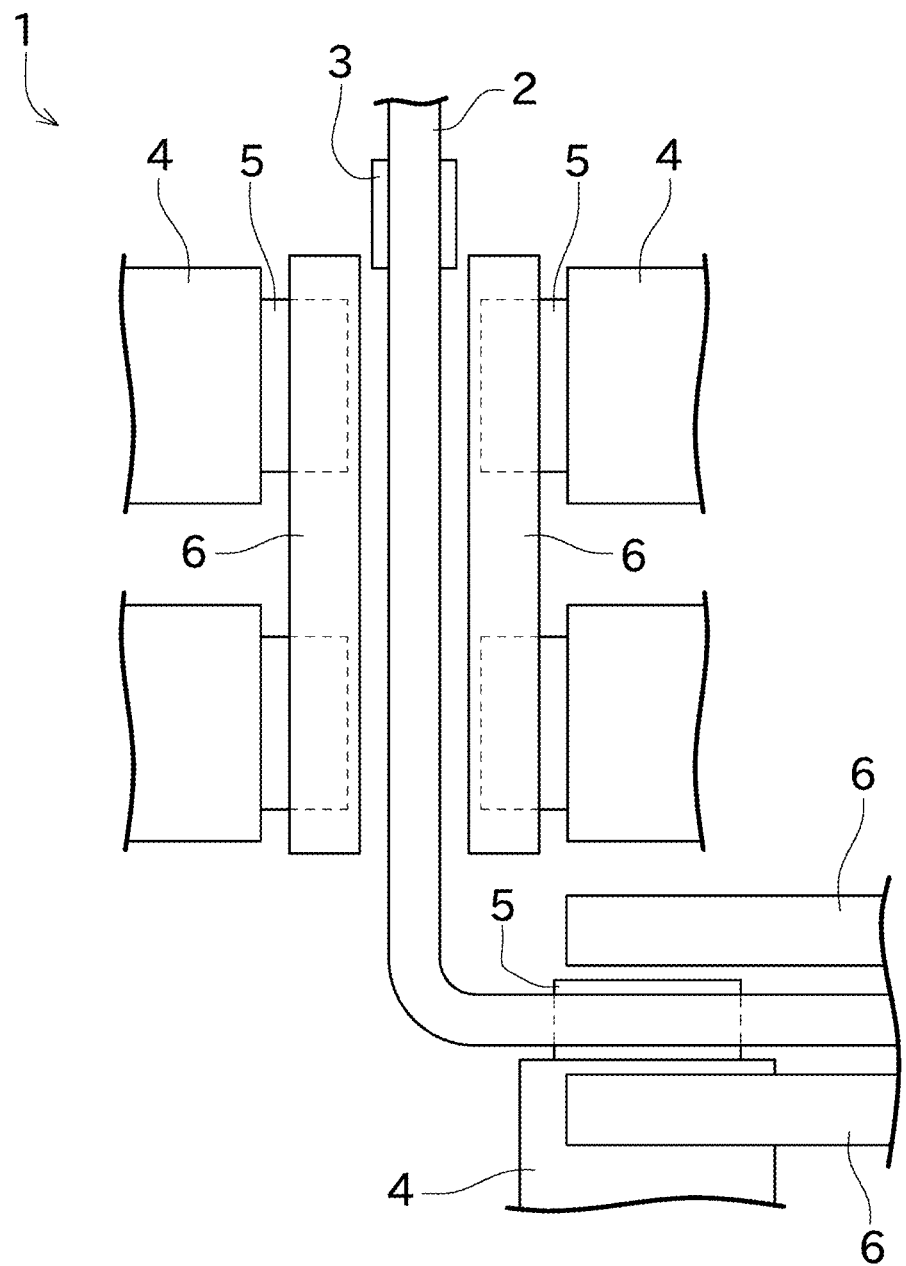
FIG. 1 is a plan view showing a transport system including a ceiling suspended shelf according to a first preferred embodiment of the present invention.

Preferred embodiments of the present invention will be described with reference to the drawings. First, referring to FIG. 1, overview of a transport system 1 will be described. FIG. 1 is a plan view showing the transport system 1 according to a first preferred embodiment of the present invention.

The transport system 1 of this preferred embodiment, which is installed in a factory (building, facility) to manufacture semiconductor products, is a system to transport various articles. Articles transported by the transport system 1 of this preferred embodiment are FOUPs (Front-Opening Unified Pods) in which wafers (semiconductor wafers) are contained. The articles may be reticle pods in which reticles are contained. As shown in FIG. 1, the transport system 1 includes a rail 2, an overhead transport vehicle 3, and ceiling suspended shelves 6.

The rail 2 is provided on a ceiling 7 of the factory. The overhead transport vehicle 3 is able to travel along the rail 2 while being suspended. Two or more overhead transport vehicles 3 may be provided, though only one overhead transport vehicle 3 is shown in FIG. 1.

In the factory, processing apparatuses 4 and load ports 5 are provided. The processing apparatus 4 is an apparatus that performs various processes on wafers contained in a FOUP. The load port 5 is connected to a space where the processing apparatus 4 performs processes. A FOUP transported by the overhead transport vehicle 3 is placed on the load port 5. Wafers in the FOUP are taken out, and then are processed by the processing apparatus 4. After being processed, the wafers are brought into the FOUP. Then, the same or another overhead transport vehicle 3 transports this FOUP to a position where another step is performed. Here, the load port 5 may be provided below the ceiling suspended shelves 6 as shown in FIG. 1, or the load port 5 and a temporary storage shelf (not shown) may be provided below the rail 2.

The ceiling suspended shelves 6 are provided on the ceiling 7 of the factory. The ceiling suspended shelves 6 are shelves where FOUPs, etc. are temporarily placed when, for example, the processing apparatus 4 and the load port 5, which are target positions, are occupied (in use). The FOUPs, etc. are temporarily placed there until the processing apparatus 4 and the load port 5 become unoccupied (available). In this preferred embodiment, the ceiling suspended shelves 6 are provided in parallel to the rail 2 and along the longitudinal direction of the rail 2. Although the ceiling suspended shelves 6 of this preferred embodiment are provided on both sides of the rail 2, a ceiling suspended shelf 6 may be provided on one side only.

Next, referring to FIG. 2 to FIG. 6, a detailed description will be provided to the rail 2, the overhead transport vehicle 3, and the ceiling suspended shelves 6. In perspective views in FIG. 3, etc., the ceiling suspended shelf 6 provided on one side of the rail 2 and an anti-drop structure 67 which will be described later are not shown.

Figure 2:
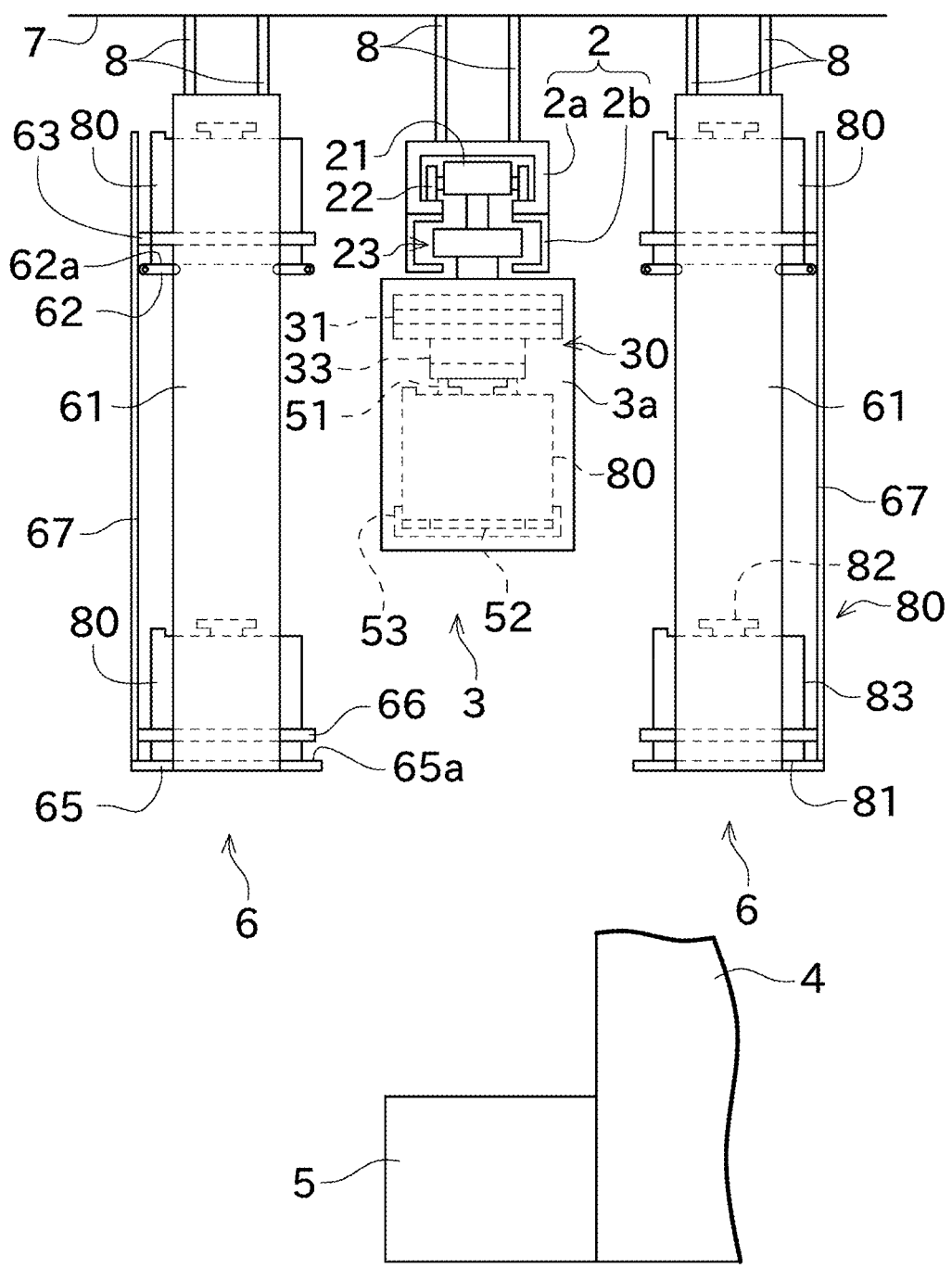
FIG. 2 is a front view showing an overhead transport vehicle and ceiling suspended shelves.

As shown in FIG. 2, poles 8 are connected to the ceiling 7 of the factory. By the poles 8, the rail 2 and the ceiling suspended shelves 6 are suspended from the ceiling 7. The overhead transport vehicle 3 is suspended from the ceiling 7 via the poles 8 and the rail 2.

Figure 3:
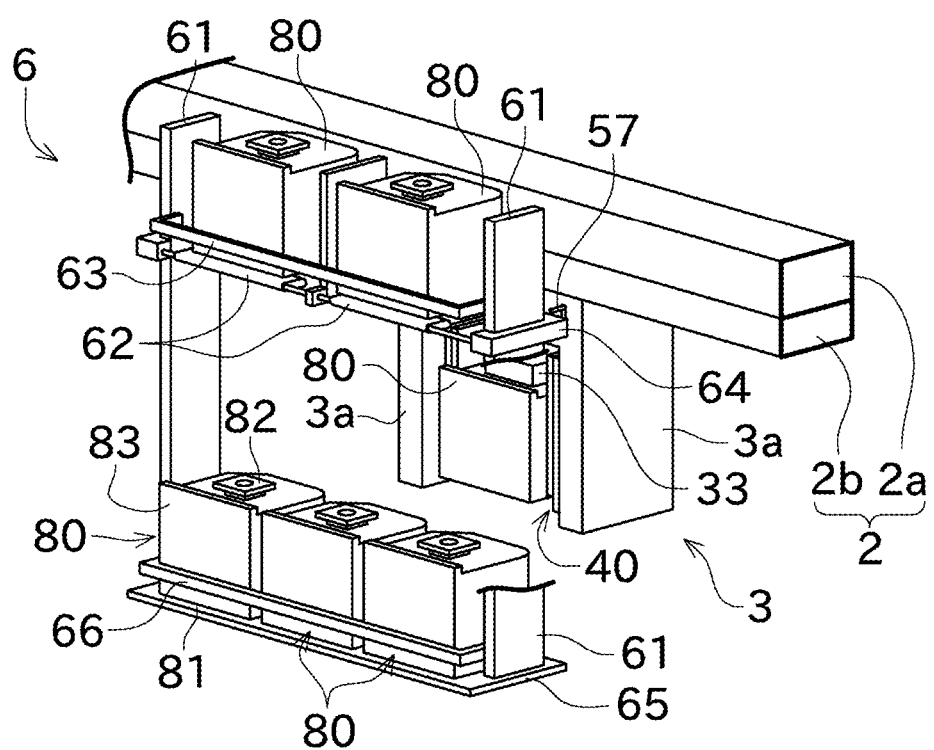
FIG. 3 is a perspective view showing the overhead transport vehicle and the ceiling suspended shelf.

As shown in FIG. 2 and FIG. 3, the ceiling suspended shelf 6 includes side plates 61, an upper shelf (first shelf) 62, and a lower shelf (second shelf) 65. The side plates 61 are suspended from the ceiling 7 by the poles 8. The side plates 61 support the upper shelf 62 and the lower shelf 65. The side plates 61 are provided at regular intervals. A space provided between two side plates 61 corresponds to one compartment. The ceiling suspended shelf 6 includes two or more compartments with identical or similar features that are continuously provided.

According to the structure of the upper shelf 62, two FOUPs 80 are able to be placed in one compartment. The upper shelf 62 is located at a position higher than the lower shelf 65. An upper support surface 62a (FIG. 2, the first support surface) of the upper shelf 62, which supports a FOUP 80, has substantially the same height as that of the rail 2. To be specific, the level of the upper support surface 62a is located between a vicinity of the lower end of the rail 2 and a vicinity of the upper end of the rail 2. Here, the wording "substantially the same" is used to encompass a case where the level of the upper support surface 62a is slightly lower than the lower end of the rail 2 and a case where the level of the upper support surface 62a is slightly higher than the upper end of the rail 2. The level at which the upper support surface 62a supports a FOUP 80 is higher than the level at which the overhead transport vehicle 3 supports a FOUP 80 while traveling, and is higher than the level at which the load port 5 supports a FOUP 80. The level of the upper support surface 62a is higher than the upper end of a lower shelf transfer device 30 which will be described later. The upper support surface 62a is at a position displaced from the overhead transport vehicle 3 with respect to the horizontal direction, and is located at a position higher than the overhead transport vehicle 3.

The ceiling suspended shelf 6 has an upper side surface guide 63, which faces a side surface 83 of a FOUP 80. The presence of the upper side surface guide 63 is able to prevent a FOUP 80 that is placed in the upper shelf 62 from dropping, mispositioning, and the like. The upper side surface guide 63 is located at a position higher than the lower end of the rail 2. The upper side surface guide 63, however, is just required to be positioned higher than the upper support surface 62a, and it is not always necessary that the upper side surface guide 63 be located at a position higher than the lower end of the rail 2.

Figure 5:
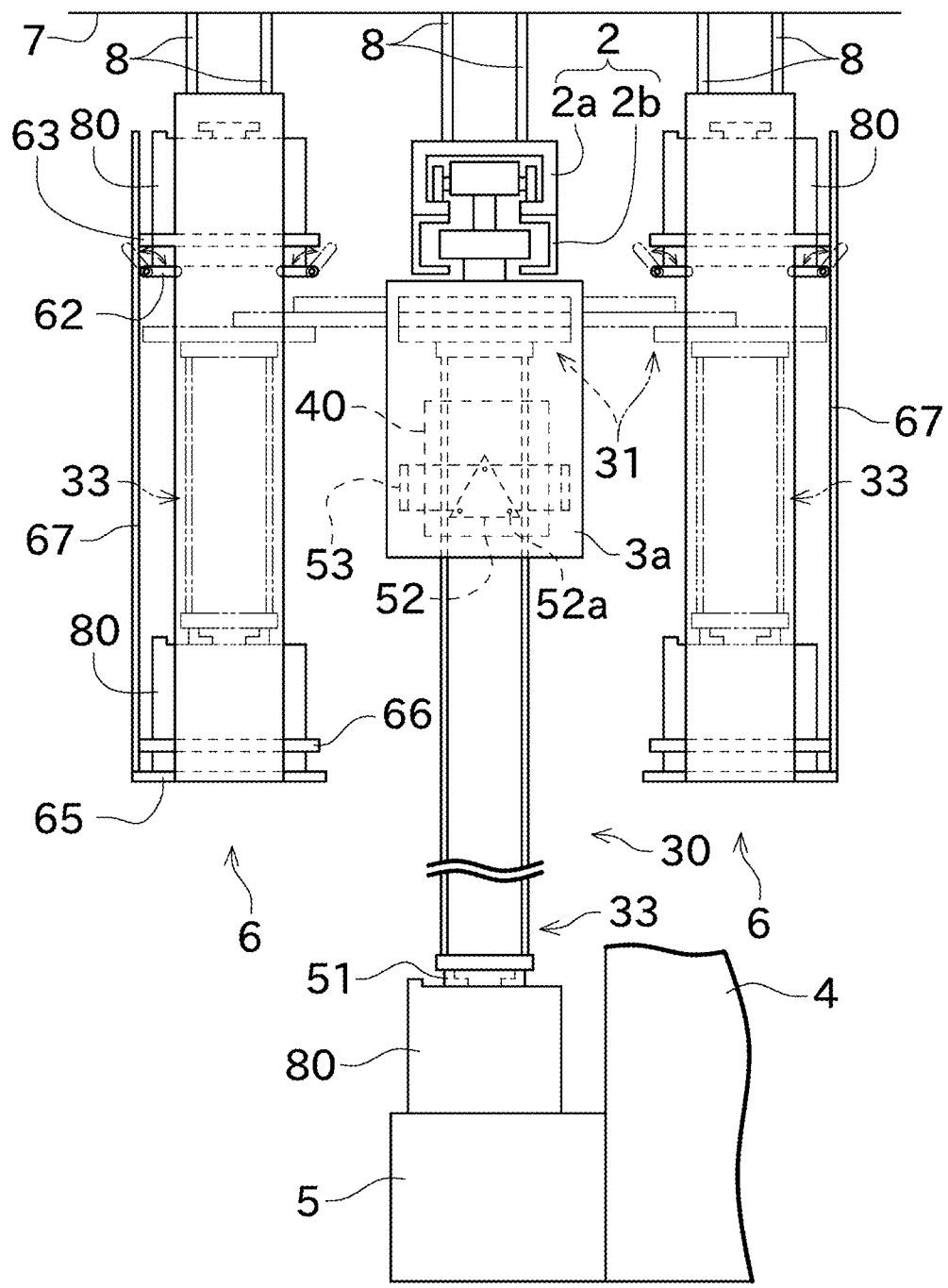
FIG. 5 is a front view showing a lower shelf transfer device of the overhead transport vehicle.

As shown in FIG. 5, the upper shelf 62 is able to rotate about a predetermined rotation axis, to thereby be opened and closed. More specifically, the upper shelf 62 is able to be brought into an open state (chain lines in FIG. 5) where the upper shelf 62 is positioned outside to allow a FOUP 80 to pass therethrough from below and a closed state where the upper shelf 62 is positioned inside, and its opening is partially or entirely closed to support a FOUP 80.

The ceiling suspended shelf 6 includes a switching mechanism 64 (FIG. 3 and FIG. 4) to switch the state of the upper shelf 62 between the open state and the closed state. The switching mechanism 64 includes a gear, a link, and the like, to transmit power received from an external source. In this preferred embodiment, the ceiling suspended shelf 6 does not have a driver to switch the state of the upper shelf 62, but power received from the overhead transport vehicle 3 is used to switch the state of the upper shelf 62 between the open state and the closed state.

Figure 4:
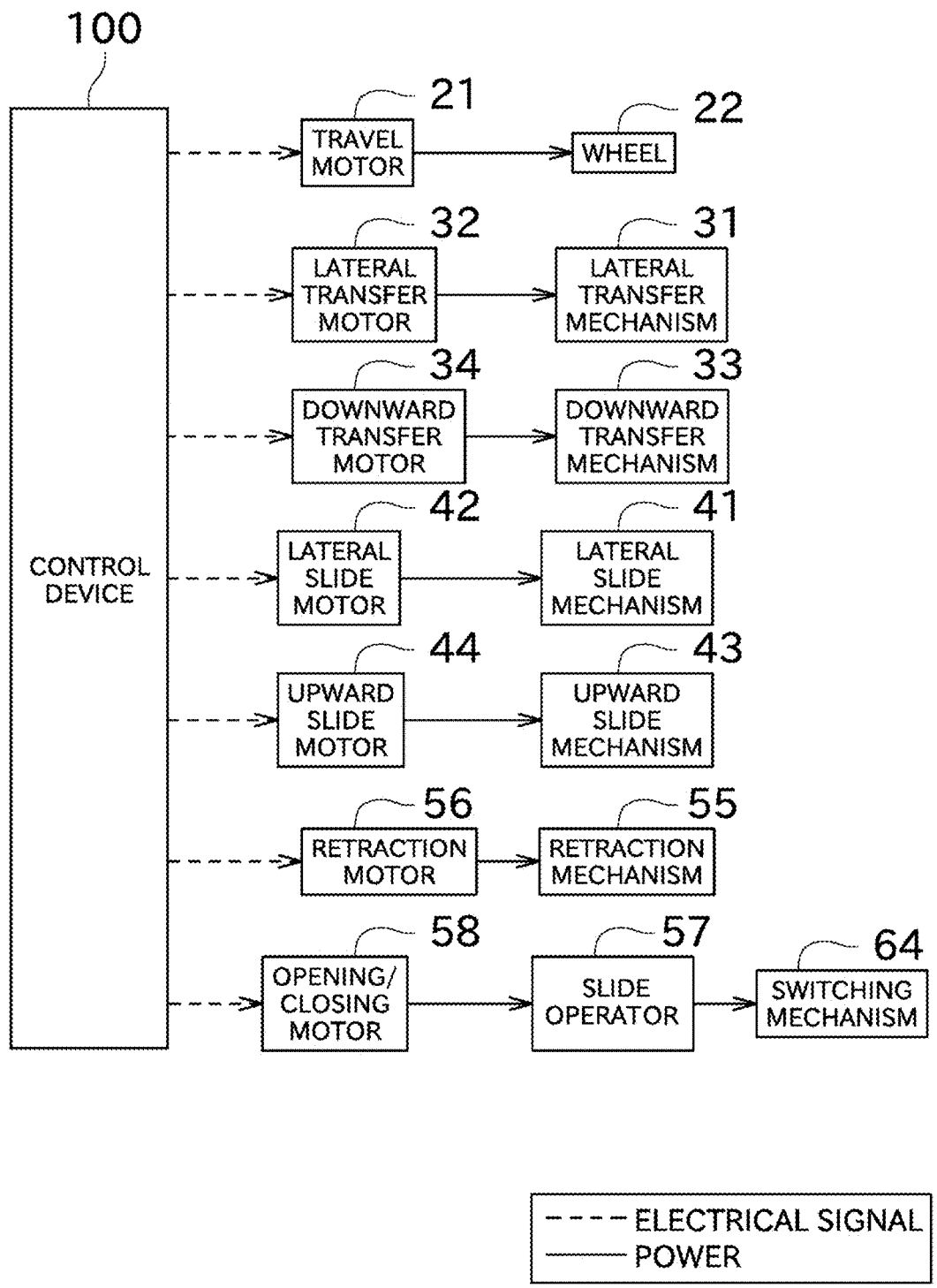
FIG. 4 is a block diagram showing a driver, and the like, provided mainly in the overhead transport vehicle.

To be specific, the overhead transport vehicle 3 includes a slide operator 57 that operates the switching mechanism 64. As shown in FIG. 4, the slide operator (operator) 57 is driven by an opening/closing motor (driver) 58. The slide operator 57 is able to change its position between a normal position and a pressing position. When the slide operator 57 is in the normal position, the slide operator 57 is not in contact with the switching mechanism 64, and the upper shelf 62 is in the closed state. When the slide operator 57 is in the pressing position, the slide operator 57 operates the switching mechanism 64 to switch the state of the upper shelf 62 to the open state.

In this preferred embodiment, switching between the open state and the closed state is implemented by rotation of the upper shelf 62. Instead, switching between the open state and the closed state may be implemented by sliding of the upper shelf 62. Alternatively or additionally, the ceiling suspended shelf 6 may be provided with a driver to switch the state of the upper shelf 62.

According to the structure of the lower shelf 65, three FOUPs 80 are able to be placed in one compartment. In the lower shelf 65, as compared to the upper shelf 62, a greater number of FOUPs 80 is able to be placed in one compartment (i.e., per unit length). This difference is caused by the fact that upper shelf 62 and the lower shelf 65 are different from each other in terms of a mechanism to place a FOUP 80, details of which will be described later. The lower shelf 65 is located at a position lower than the upper shelf 62. The level at which a lower support surface 65a (the second support surface) of the lower shelf 65 supports a FOUP 80 is lower than the level at which the overhead transport vehicle 3 supports a FOUP 80 while traveling, and is higher than the level at which the load port 5 supports a FOUP 80. The upper end of a FOUP 80 supported by the lower support surface 65a is located below the lower end of a later-described upper shelf transfer device 40 (and more specifically, below the lower end of the upper shelf transfer device 40 after lateral movement thereof).

The lower shelf 65 is always in the closed state, and its state is not able to be switched unlike the upper shelf 62. In other words, the lower shelf 65 does not allow a FOUP 80 to pass therethrough in the up-down direction. A specific structure of the lower shelf 65 is a shelf board that connects adjacent side plates 61.

The ceiling suspended shelf 6 has a lower side surface guide 66, which faces a side surface 83 of a FOUP 80. The presence of the lower side surface guide 66 is able to prevent a FOUP 80 that is placed in the lower shelf 65 from dropping, mispositioning, and the like.

The ceiling suspended shelf 6 has the anti-drop structure 67. The anti-drop structure 67 is a net, a fence, a flat plate, or the like. The anti-drop structure 67 is provided on the side (back side) of the ceiling suspended shelf 6 opposite to the front side, where the front side refers to the side facing the rail 2 (overhead transport vehicle 3). In a plan view, the anti-drop structure 67 is provided on the side far from the rail 2 with respect to a direction perpendicular to the rail 2. When a FOUP 80 placed in the upper shelf 62 or in the lower shelf 65 moves or falls toward the side away from the rail 2, the anti-drop structure 67 prevents dropping of the FOUP 80 by coming into contact with the FOUP 80.

To reliably prevent the FOUP 80 from dropping, the anti-drop structure 67 of this preferred embodiment covers a range from the lower end to the upper end of a FOUP 80 placed in the upper shelf 62 or in the lower shelf 65. In other words, the whole of the FOUP 80 overlaps the anti-drop structure 67 when viewed in a direction perpendicular to a surface of the anti-drop structure 67. In this preferred embodiment, the anti-drop structure 67 covers a range from the lower end of the upper shelf 62 to the upper end of a FOUP 80 placed in the lower shelf 65, but alternatively, the anti-drop structure 67 may be divided into a portion corresponding to the upper shelf 62 side and a portion corresponding to the lower shelf 65 side.

The anti-drop structure 67 is provided on the side opposite to the overhead transport vehicle 3 across a FOUP 80 placed in the upper shelf 62 or in the lower shelf 65. Accordingly, even if a FOUP 80 being placed into the upper shelf 62 or the lower shelf 65 from the overhead transport vehicle 3 comes into contact with another FOUP 80 already placed therein, dropping of the already placed FOUP 80 is able to be prevented.

The rail 2 includes a travel rail 2a and an electricity supply rail 2b. The travel rail 2a includes a travel support surface that supports the overhead transport vehicle 3 (and specifically a wheel 22 which will be described later), and that allows the overhead transport vehicle 3 to travel. The electricity supply rail 2b is provided on the lower side of the travel rail 2a. The electricity supply rail 2b, in which an electricity supply line (not shown) is provided, supplies electric power to the overhead transport vehicle 3.

The overhead transport vehicle 3 includes a travel motor 21, a wheel 22, and an electricity receiver 23, which allow the overhead transport vehicle 3 to travel along the rail 2. The travel motor 21 is provided in the travel rail 2a. The travel motor 21 generates power for the overhead transport vehicle 3 to travel. The wheel 22 is in contact with the above-described travel support surface of the travel rail 2a. The wheel 22 is driven into rotation by the travel motor 21. The electricity receiver 23 is provided in the electricity supply rail 2b. The electricity receiver 23, which is, for example, a pick-up coil that receives electric power from the electricity supply line of the electricity supply rail 2b, supplies electric power from the electricity supply line to electric devices such as the travel motor 21.

As shown in FIG. 4, various drive sources and electric devices such as the travel motor 21 are controlled by a control device 100. The control device 100 is implemented as a computer provided at an appropriate position in the overhead transport vehicle 3. The control device 100 includes an arithmetic processor such as a CPU, a memory such as a flash memory or a hard disk, and an input/output to communicate with an external device or the like. The memory stores various programs and set values. The arithmetic processor reads out various programs, and the like, from the memory, and controls operations of respective portions of the overhead transport vehicle 3.

As shown in FIG. 3, the overhead transport vehicle 3 includes a pair of coverings 3a, which are provided one behind the other with respect to a travel direction. A structure to hold and transfer a FOUP 80 is provided between the pair of coverings 3a.

As shown in FIG. 2, etc., the overhead transport vehicle 3 includes a chuck (second holder) 51 and a holding base (first holder) 52, which hold a FOUP 80. The chuck 51 grips and holds a flange portion 82 of an upper surface of the FOUP 80. The chuck 51 is switchable between holding and not holding the flange portion 82.

Figure 6:
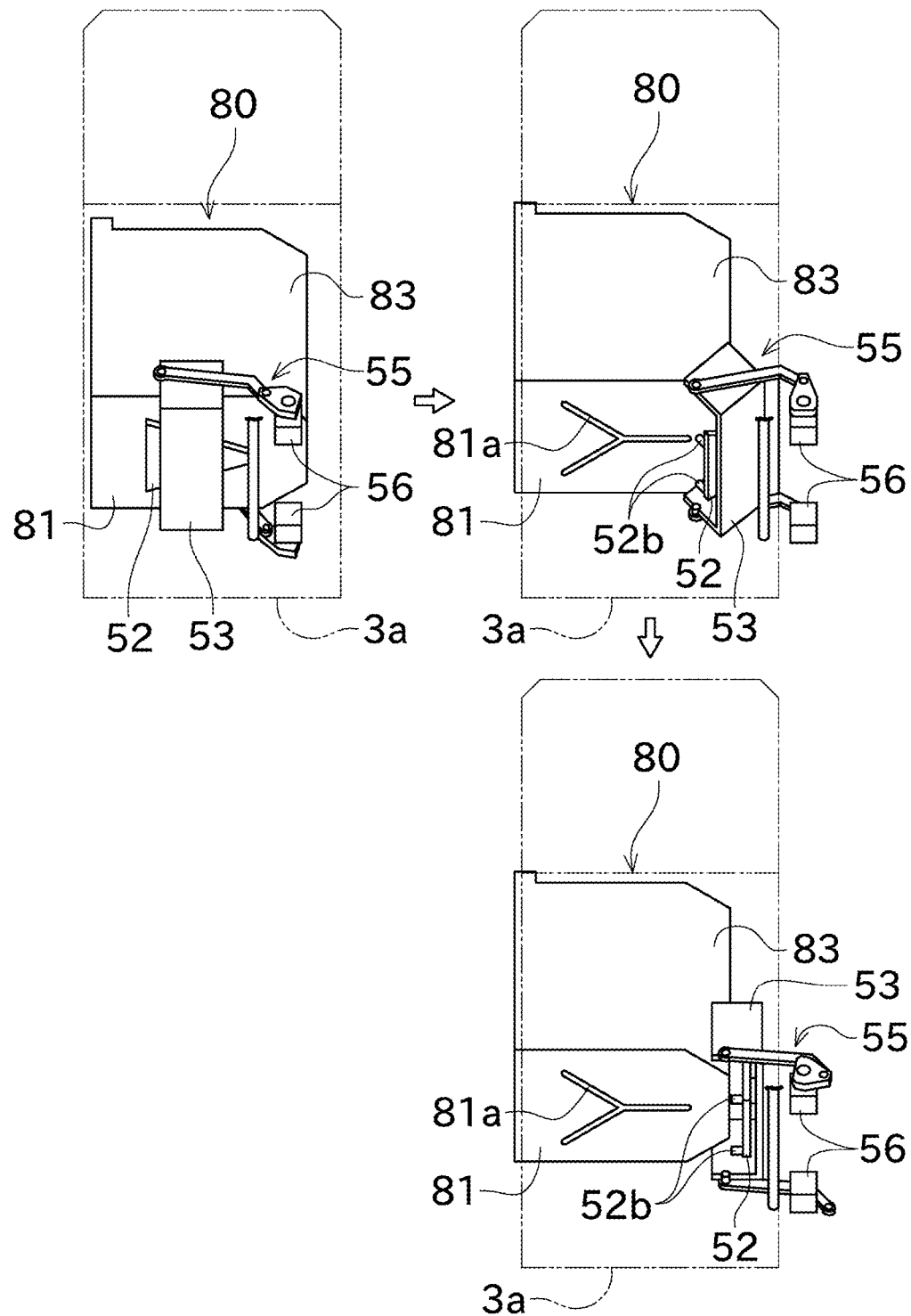
FIG. 6 is a perspective view showing a retraction mechanism provided on the bottom surface side of a FOUP.
Figure 9:
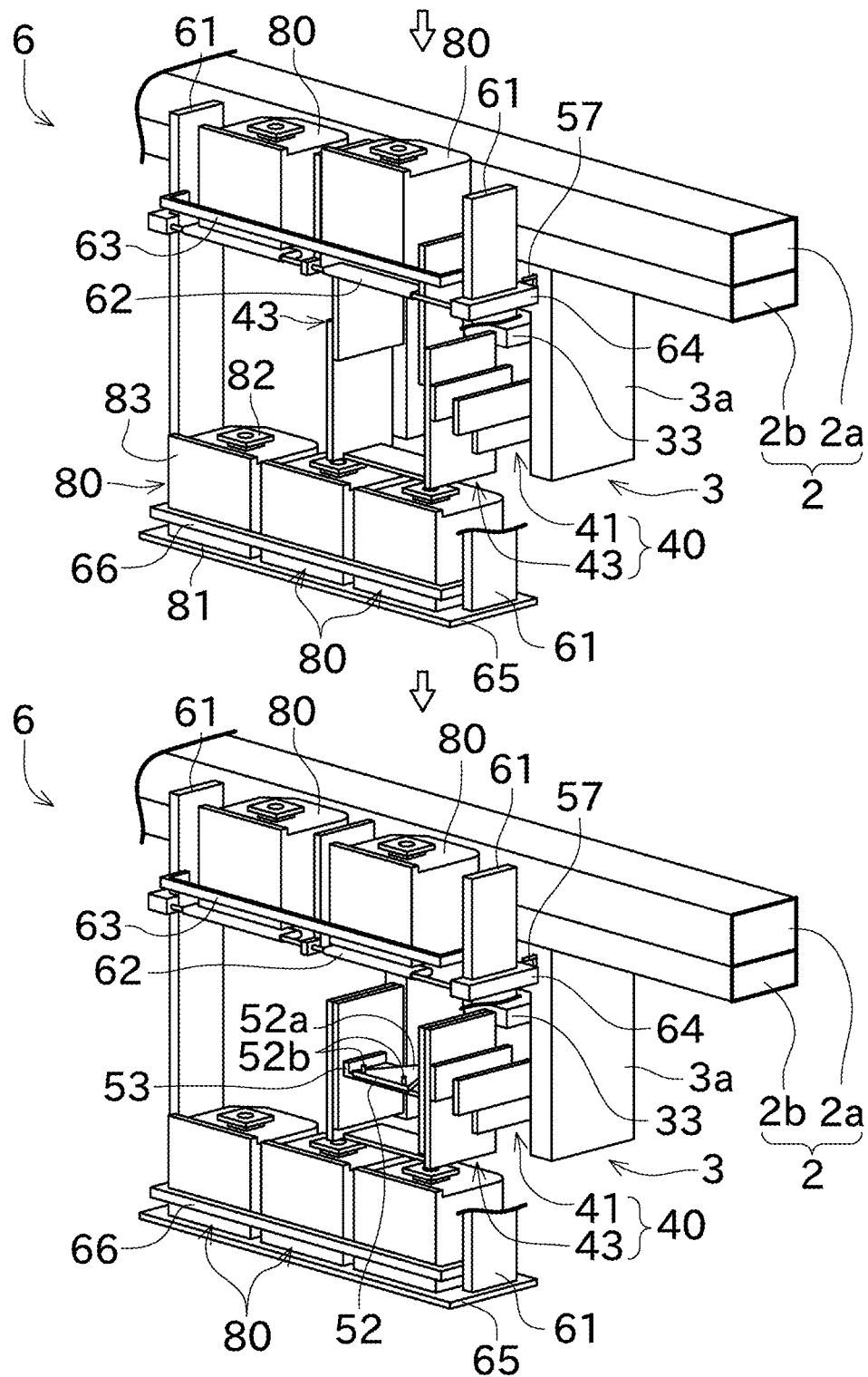
FIG. 9 is a perspective view illustrating FOUPs being placed on the upper shelf.

The holding base 52 holds a bottom surface 81 of the FOUP 80. To be specific, as shown in FIG. 5, FIG. 6, FIG. 9, etc., a holding surface 52a (a surface coming into contact with the bottom surface 81) of the holding base 52 has a plurality of insertion pins 52b provided at predetermined positions. On the other hand, the bottom surface 81 of the FOUP 80 has a recess 81a having a predetermined shape, as shown in FIG. 6. The positions where the plurality of insertion pins 52b are formed correspond to the shape of the recess 81a. Accordingly, by inserting the insertion pins 52b into the recess 81a, the FOUP 80 is able to be stably held. Provided near the holding base 52 is a guide 53 to prevent mispositioning, and the like, of the FOUP 80.

While the overhead transport vehicle 3 is traveling, the holding base 52 holds a FOUP 80. In the following description, a position where the overhead transport vehicle 3 holds a FOUP 80 while traveling will be referred to as a hold position. Holding a FOUP 80 by the holding base 52 is able to stabilize the FOUP 80. Alternatively, while the overhead transport vehicle 3 is traveling, a FOUP 80 may be held by both the chuck 51 and the holding base 52 or by the chuck 51 alone.

The overhead transport vehicle 3 includes: the lower shelf transfer device (second transfer device) 30 that moves a FOUP 80 located in the hold position, to place the FOUP 80 into the lower shelf 65 (downward transfer position); and the upper shelf transfer device (first transfer device) 40 that moves a FOUP 80 located in the hold position, to place the FOUP 80 into the upper shelf 62 (upper transfer position). The lower shelf transfer device 30 is used also to place a FOUP 80 into the load port 5.

First, the lower shelf transfer device 30 will be described. The lower shelf transfer device 30 is able to move the chuck 51 in the lateral direction (horizontal direction) (third movement), and also able to move the chuck 51 in the downward direction (fourth movement). As shown in FIG. 2, FIG. 5, and the like, the lower shelf transfer device 30 includes a lateral transfer mechanism 31 and a downward transfer mechanism 33. As shown in FIG. 4, the lateral transfer mechanism 31 is driven by a lateral transfer motor 32, and the downward transfer mechanism 33 is driven by a downward transfer motor 34.

The lateral transfer mechanism 31 is able to move the chuck 51 in the lateral direction (specifically, in a direction perpendicular to the forward direction in a plan view). More specifically, the lateral transfer mechanism 31 includes a plurality of movable plates that are able to move in the lateral direction. The chuck 51 is able to move integrally with the lowermost movable plate. The lateral transfer mechanism 31 uses power from the lateral transfer motor 32, to slide each of the movable plates in the lateral direction as shown in FIG. 5, thereby causing the chuck 51 supported by the lateral transfer mechanism 31 to move in the lateral direction. As a result, the FOUP 80 is able to be moved in the lateral direction. In this preferred embodiment, the upper support surface 62a is located at a position higher than the upper end of the lateral transfer mechanism 31, and therefore, during lateral movement of the lateral transfer mechanism 31, the lateral transfer mechanism 31 does not come into contact with either the upper shelf 62 and the FOUP 80 supported by the upper shelf 62, for example.

The downward transfer mechanism 33 is able to move the chuck 51 in the downward direction. The downward transfer mechanism 33 is a hoist, for example, and is able to lower and retrieve a suspension structure such as a wire, as shown in FIG. 5, by using power from the downward transfer motor 34. Accordingly, the FOUP 80 is able to be moved in the up-down direction.

The downward transfer mechanism 33 is able to move integrally with the lowermost movable plate of the lateral transfer mechanism 31. Thus, lateral movement of the lateral transfer mechanism 31 and downward movement of the downward transfer mechanism 33 are able to be compatible. Accordingly, a transfer position to which the lower shelf transfer device 30 is able to transfer a FOUP 80 is able to be located not only directly below and directly beside but also obliquely below.

Here, while a FOUP 80 is held by the holding base 52, interference among components occurs to disable movement of the FOUP 80 by the lower shelf transfer device 30 (especially the downward transfer mechanism 33). In this preferred embodiment, therefore, before the lower shelf transfer device 30 moving the FOUP 80, the holding base 52 is removed from the FOUP 80 and retracted from the lower side of the FOUP 80 (from a trajectory of the chuck 51 being moved downward by the lower shelf transfer device 30). For this retraction, the overhead transport vehicle 3 includes a retraction mechanism 55 and a retraction motor 56, as shown in FIG. 6.

The retraction mechanism 55 includes a link that is operated with power from the retraction motor 56. The link is rotatably coupled to the guide 53. The holding base 52 is able to move integrally with the guide 53 in a predetermined trajectory. Accordingly, by operating the link of the retraction mechanism 55 with power from the retraction motor 56, the holding base 52 and the guide 53 are able to be moved to the back side of the FOUP 80, that is, are able to be retracted from a position below the FOUP 80. Here, it may be acceptable that a temporary shelf (UTB: Under Track Buffer) suspended from the ceiling 7 is additionally provided below the rail 2. The temporary shelf is in a position overlapping the rail 2 in a plan view, and is installed with a phase shift from the load port 5 with respect to a direction in which the rail 2 extends. The second transfer device is able to transfer a FOUP 80 to the temporary shelf.

As described above, while the overhead transport vehicle 3 is traveling, a FOUP 80 is held by the holding base 52 and is not held by the chuck 51. To transfer the FOUP 80 to the lower shelf 65 or to the load port 5 after the overhead transport vehicle 3 stops, the chuck 51 holds the FOUP 80, and then the retraction motor 56 is driven to remove the holding base 52 from the FOUP 80. After that, transfer is performed by the lower shelf transfer device 30.

Next, the upper shelf transfer device 40 will be described mainly with reference to FIG. 7 and FIG. 8.

Figure 7:
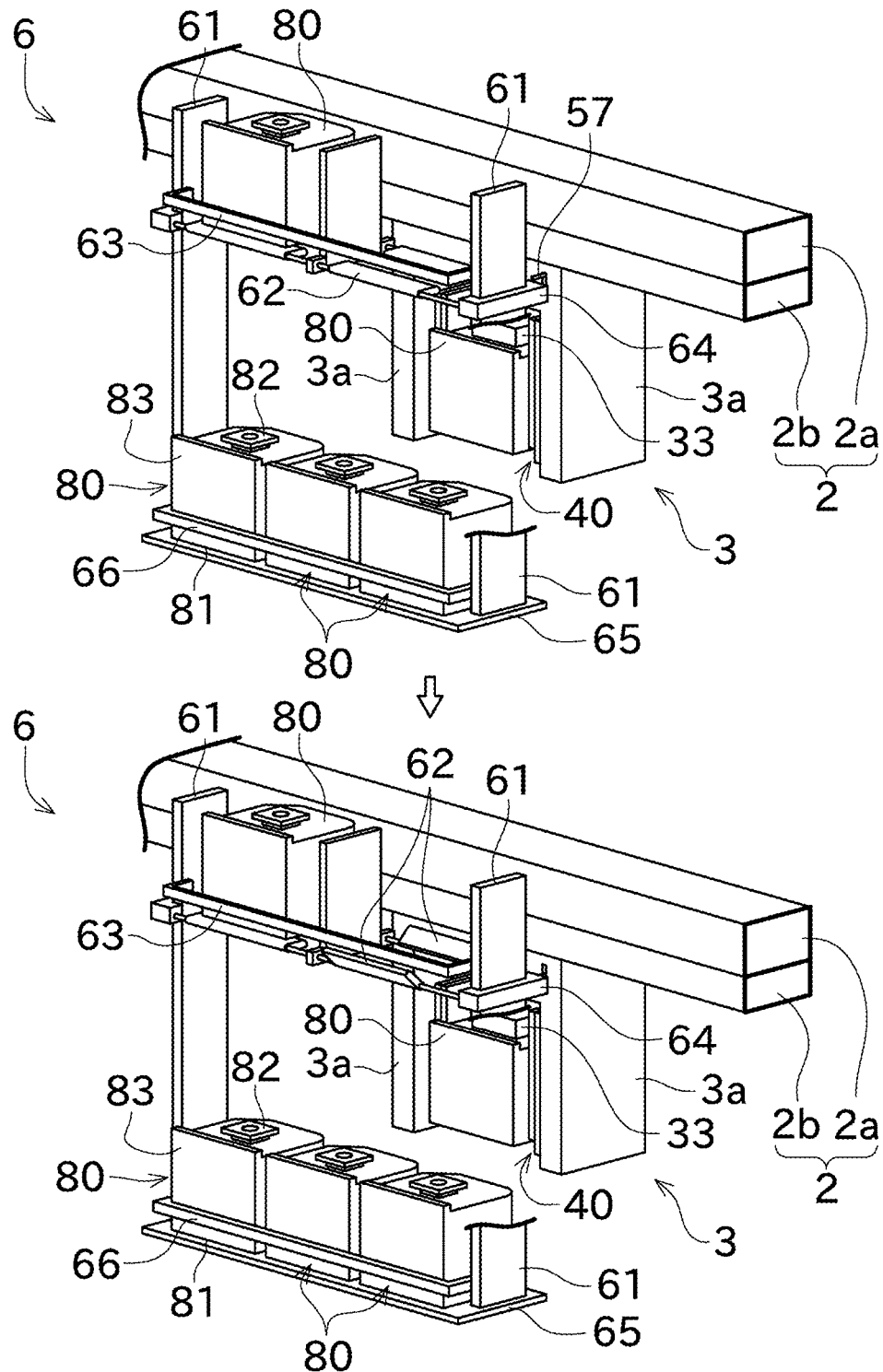
FIG. 7 is a perspective view illustrating an upper shelf being switched from a closed state to an open state.
Figure 8:
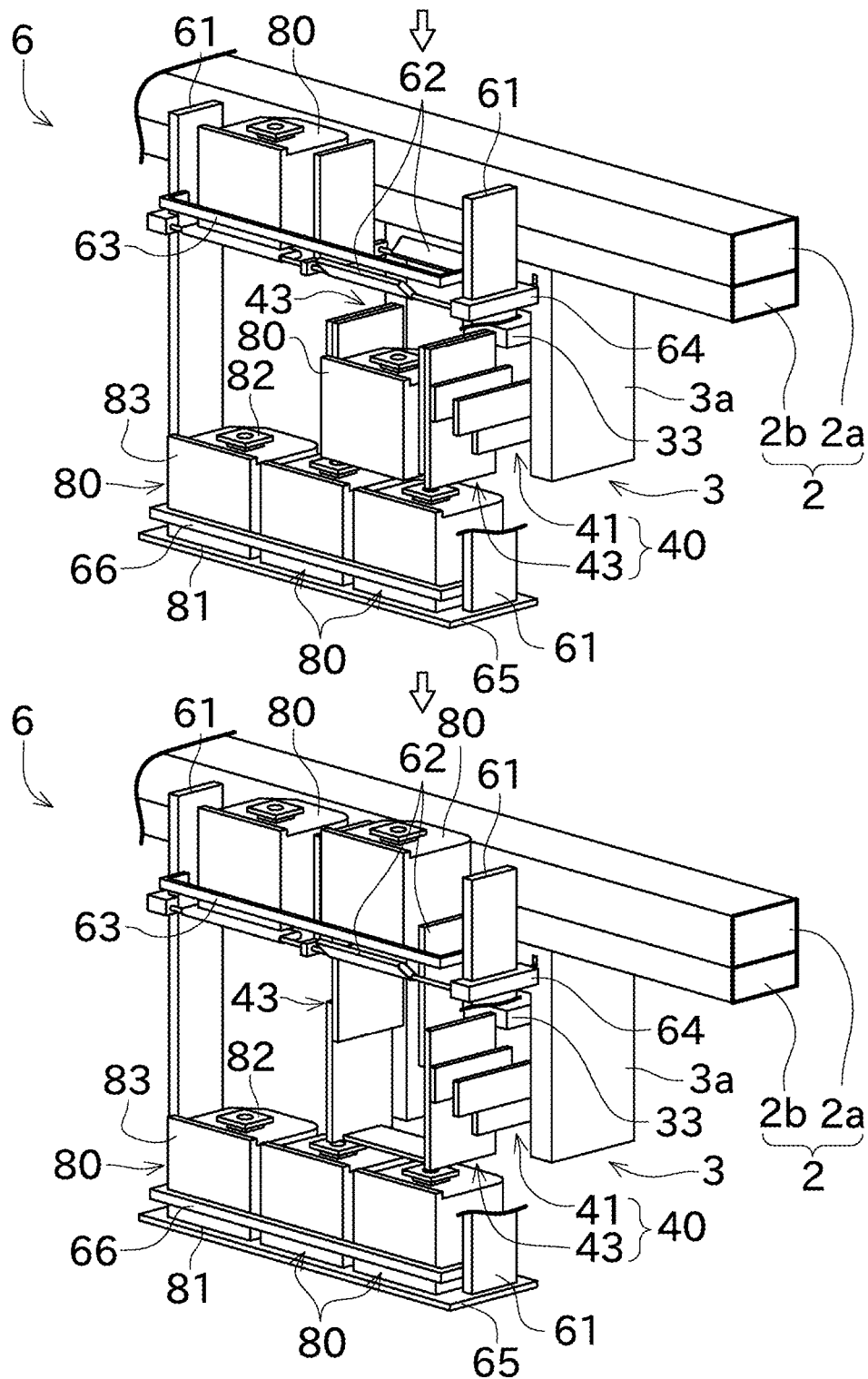
FIG. 8 is a perspective view illustrating a lateral slide mechanism and an upward slide mechanism of an upper shelf transfer device being operated.

As shown in FIG. 7 and FIG. 8, the upper shelf transfer device 40 is provided in a space between the covering 3a and a FOUP 80 with respect to the travel direction. The upper shelf transfer device 40 is able to move the holding base 52 in the lateral direction (first movement), and also able to move the holding base 52 in the upward direction (second movement). In the first movement, it is sufficient that the moving direction includes the lateral direction. Thus, directions other than the direct lateral direction are allowed. The same applies to the second and subsequent movements. As shown in FIG. 8, the upper shelf transfer device 40 includes a lateral slide mechanism 41 and an upward slide mechanism 43. As shown in FIG. 4, the lateral slide mechanism 41 is driven by a lateral slide motor 42, and the upward slide mechanism 43 is driven by an upward slide motor 44.

The lateral slide mechanism 41 is able to move the holding base 52 in the lateral direction (specifically, in a direction perpendicular to the forward direction in a plan view). More specifically, the lateral slide mechanism 41 includes a plurality of movable plates that are able to move in the lateral direction. The lateral slide mechanism 41 includes three movable plates that are coupled to one another by a belt or a chain. The holding base 52 is able to move integrally with the innermost movable plate. The lateral slide mechanism 41 uses power of the lateral slide motor 42, to slide each of the movable plates in the lateral direction as shown in FIG. 8, thereby causing the holding base 52 supported by the lateral slide mechanism 41 to move in the lateral direction. As a result, the FOUP 80 is able to be moved in the lateral direction.

The upward slide mechanism 43 is able to move the holding base 52 in the upward direction. Specifically, the upward slide mechanism 43 includes a plurality of movable plates that are able to move in the upward direction. The holding base 52 is able to move integrally with the innermost movable plate. The upward slide mechanism 43 uses power from the upward slide motor 44, to slide each of the movable plates in the upward direction as shown in FIG. 8, thereby causing the holding base 52 supported by the upward slide mechanism 43 to move in the upward direction. As a result, the FOUP 80 is able to be moved in the upward direction. In this preferred embodiment, while transferring the FOUP 80 to the upper shelf 62, the upward slide mechanism 43 keeps to be positioned on a side surface of the FOUP 80. Therefore, the upper shelves 62 are spaced away from each other by a large interval, in order to avoid interference of the upward slide mechanism 43 with another FOUP 80. Accordingly, the number of FOUPs 80 that are able to be placed in one compartment of the upper shelf 62 is different from that of the lower shelf 65.

Next, referring to FIG. 7 to FIG. 9, how a FOUP 80 in the hold position is transferred to the upper shelf 62 will be described.

First, the overhead transport vehicle 3 stops on the lateral side of an upper shelf 62 defining and functioning as a transfer destination (the upper drawing in FIG. 7). Then, the overhead transport vehicle 3 moves the slide operator 57 to the pressing position, and the upper shelf 62 is switched from the closed state to the open state (the lower drawing in FIG. 7). In a case where, unlike the present preferred embodiment, the FOUP 80 is held by the chuck 51 alone while the overhead transport vehicle 3 is traveling; the chuck 51 is detached, and the FOUP 80 is held by the holding base 52.

Then, the overhead transport vehicle 3 operates the lateral slide mechanism 41, to move the FOUP 80 in the lateral direction (the upper drawing in FIG. 8). At this time, the FOUP 80 is positioned directly below the upper shelf 62. Then, the overhead transport vehicle 3 operates the upward slide mechanism 43, to move the FOUP 80 in the upward direction (the lower drawing in FIG. 8). At this time, to provide appropriate rotation of the upper shelf 62, the FOUP 80 is positioned above the upper transfer position. In this preferred embodiment, completion of the lateral movement by the lateral slide mechanism 41 is followed by upward movement by the upward slide mechanism 43. Alternatively, the upward movement is able to be started before completion of the lateral movement. As described above, after lateral movement of the upper shelf transfer device 40 (lateral slide mechanism 41), its lower end is located above the upper end of a FOUP 80 supported by the lower shelf 65 (more specifically, is located at a position overlapping the upper end of the FOUP 80 in a plan view). Accordingly, interference of the lateral slide mechanism 41 with the FOUP 80 placed in the lower shelf 65 is prevented.

Then, the overhead transport vehicle 3 moves the slide operator 57 to the normal position, and the upper shelf 62 is switched from the open state to the closed state (the upper drawing in FIG. 9). Then, the overhead transport vehicle 3 starts an operation to store the upward slide mechanism 43 and the lateral slide mechanism 41 into the overhead transport vehicle 3 (the lower drawing in FIG. 9).

Since the overhead transport vehicle 3 includes the upper shelf transfer device 40 and the ceiling suspended shelf 6 includes the upper shelf 62, a FOUP 80 is able to be placed at a high position (in this preferred embodiment, at the same level as that of the rail 2). Accordingly, more effective use of a space in the factory is achieved, particularly with respect to a space directly beside the rail 2, which has not previously been effectively used. Especially in a factory to manufacture semiconductor products, a high cleanliness in the factory is required, and therefore the equipment cost increases as the space in the factory increases. Thus, the transport system 1 of this preferred embodiment is particularly effective in a factory to manufacture semiconductor products.

All of the overhead transport vehicles 3 included in the transport system 1 may include the upper shelf transfer devices 40, or only a portion of the overhead transport vehicles 3 may include the upper shelf transfer device(s) 40. In the latter case, the lower shelf transfer devices 30 may be included in the portion of the overhead transport vehicles 3 and the lower shelf transfer devices 30 included in the rest of them have identical or similar features. Accordingly, the lower shelf 65 is able to be commonly used by the portion and the rest of the overhead transport vehicles 3.

Figure 10:
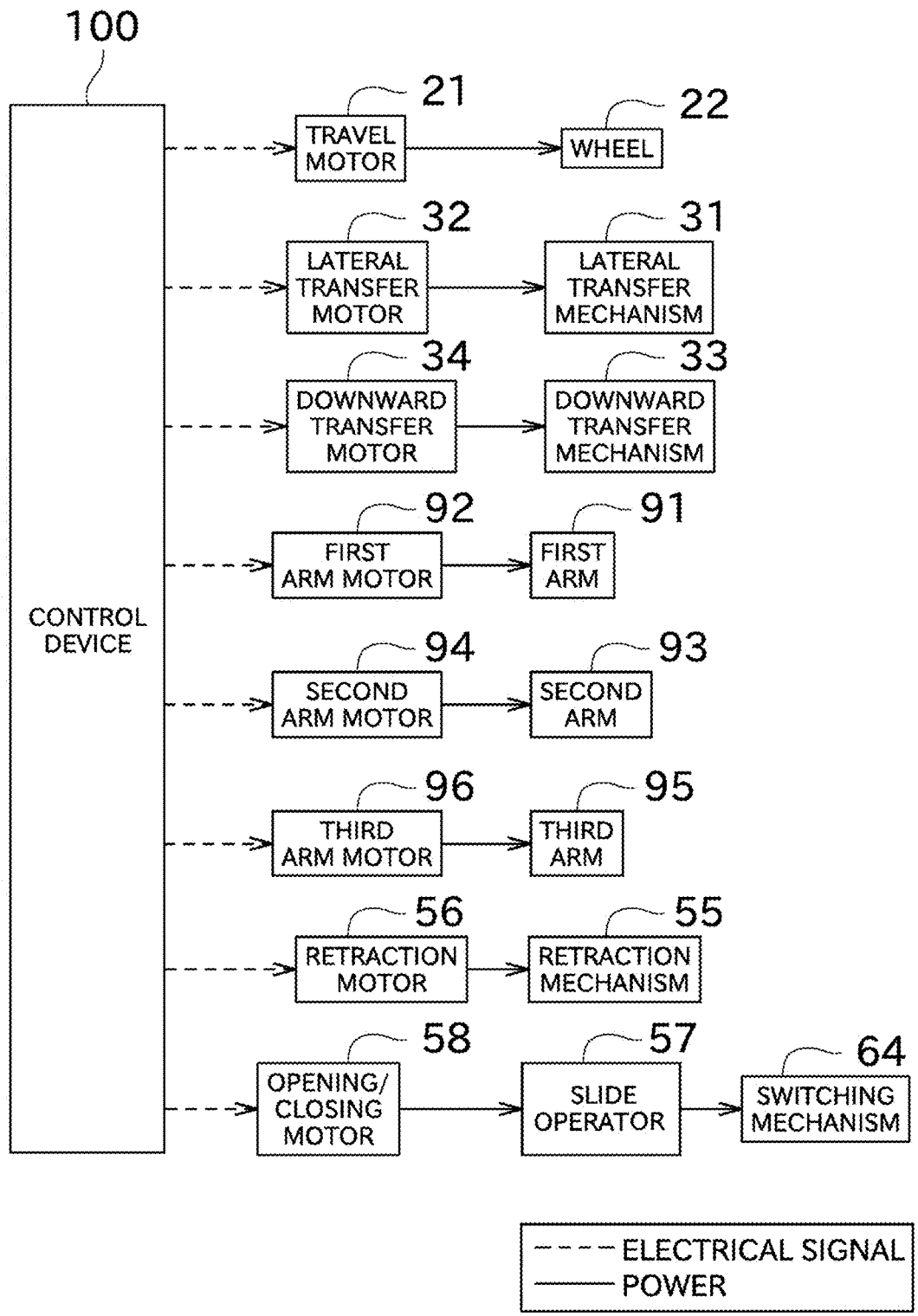
FIG. 10 is a block diagram showing a driver, and the like, provided in an overhead transport vehicle according to a second preferred embodiment of the present invention.

Next, referring to FIG. 10 and FIG. 11, a second preferred embodiment will be described.

In the first preferred embodiment described above, the upper shelf transfer device 40 includes the lateral slide mechanism 41 and the lateral slide motor 42. The second preferred embodiment, on the other hand, has an upper shelf transfer device 90 is an arm mechanism including a plurality of arms that are rotatably coupled to one another.

Figure 11:
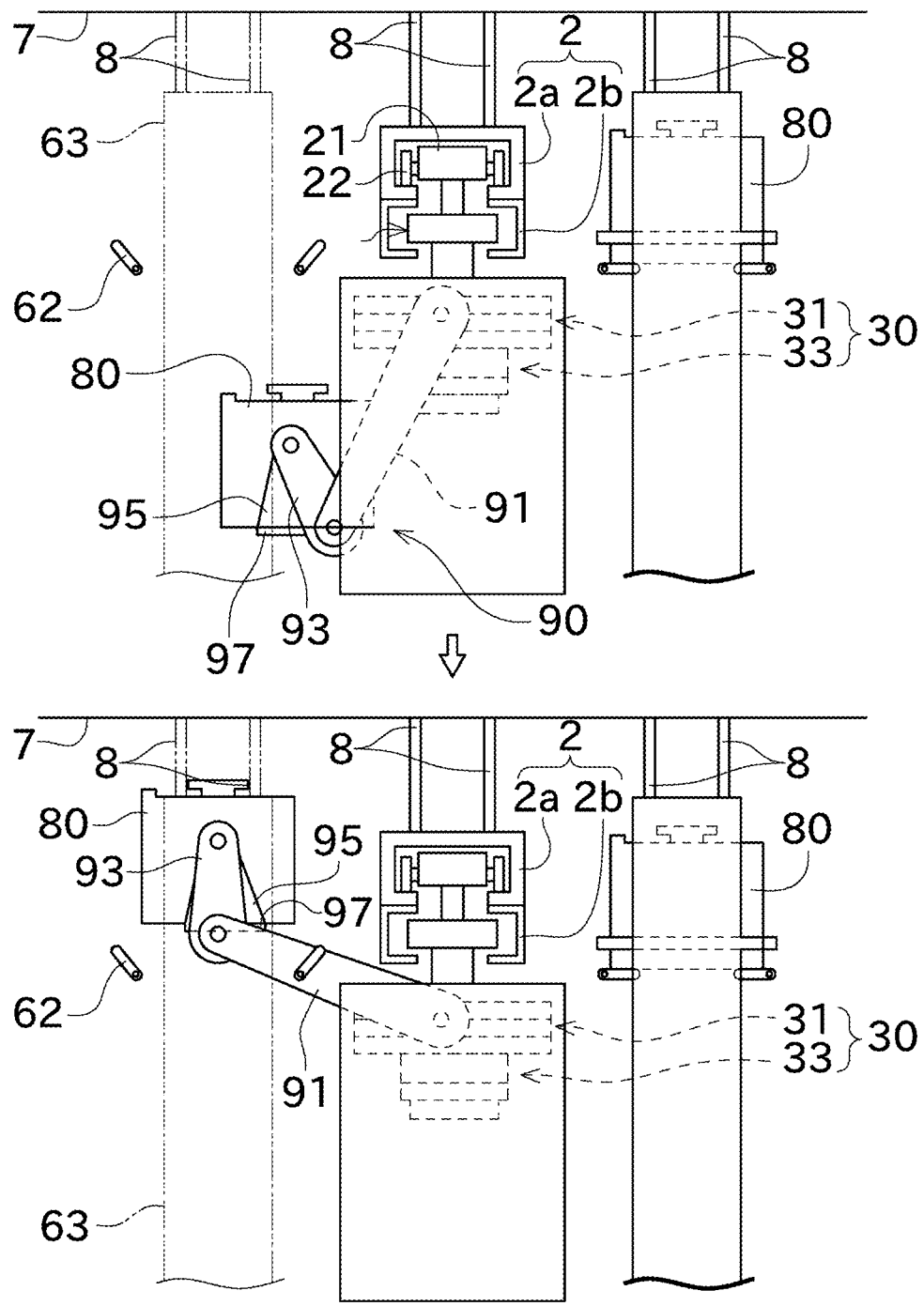
FIG. 11 is a front view illustrating an upper shelf transfer device of the second preferred embodiment of the present invention being operated.

To be specific, as shown in FIG. 11, the upper shelf transfer device 90 includes a first arm 91, a second arm 93, and a third arm 95 provided in this order from the side close to the overhead transport vehicle 3. As shown in FIG. 10, the first arm 91 is driven by a first arm motor 92, the second arm 93 is driven by a second arm motor 94, and the third arm 95 is driven by a third arm motor 96. Thus, the arms are able to operate independently of one another.

The base end of the first arm 91 is coupled to the overhead transport vehicle 3, and the distal end of the first arm 91 is rotatably coupled to the base end of the second arm 93. The distal end of the second arm 93 is rotatably coupled to the base end of the third arm 95. Coupled to the distal end of the third arm 95 is a first holder 97.

To transfer a FOUP 80 by the upper shelf transfer device 90, adjusting the rotation angles of the first arm 91, the second arm 93, and the third arm 95 are able to move the first holder 97 to the upper shelf 62 while keeping the first holder 97 horizontal, as shown in FIG. 11. More specifically, first, the FOUP 80 is held by the overhead transport vehicle 3, and in this state, the first arm 91 is rotated and the first holder 97 moves mainly in the lateral direction (first movement; the upper drawing in FIG. 11). Then, as the rotation angle of the first arm 91 increases, the first holder 97 moves mainly in the upward direction (second movement; the lower drawing in FIG. 11). Since the rotation of the first arm 91 changes the rotation angles of the second arm 93 and the third arm 95, the second arm 93 and the third arm 95 are rotated to set the first holder 97 to be horizontal.

Figure 12:
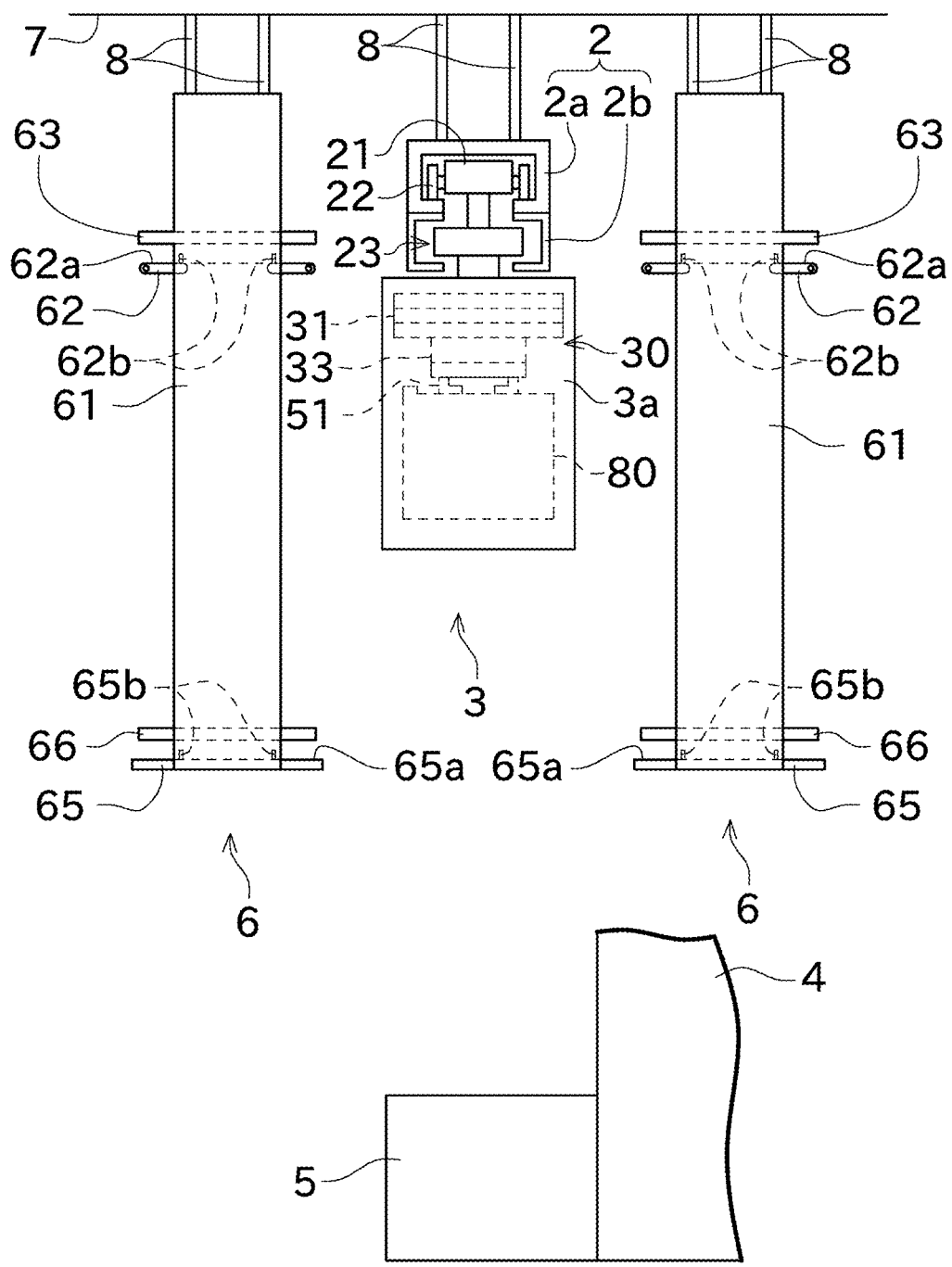
FIG. 12 is a front view showing a ceiling suspended shelf according to a third preferred embodiment of the present invention.

Next, referring to FIG. 12, a third preferred embodiment of the present invention will be described.

In the first preferred embodiment, the upper shelf transfer device 40 moves a FOUP 80 with the insertion pins 52b of the holding base 52 being received in the recess 81a of the FOUP 80. Instead, insertion pins 62b (FIG. 12) may be provided on the upper support surface 62a of the upper shelf 62. By inserting the insertion pins 62b into the recess 81a of the FOUP 80, the posture of the FOUP 80 placed in the upper shelf 62 is able to be stabilized. Instead of or in addition to the upper shelf 62, the lower shelf may have insertion pins 65b provided on its lower support surface 65a, and the insertion pins 65b are received in the recess 81a of the FOUP 80.

The recess 81a of the FOUP 80 may include a first recess to receive the insertion pins 52b of the holding base 52, and a second recess to receive the insertion pins 62b of the upper shelf 62 (or the insertion pins 65b of the lower shelf 65). Accordingly, the posture of the FOUP 80 is able to be stabilized both during and after upward transfer of the FOUP 80. The features of the first to third preferred embodiments are able to be combined as appropriate. For example, the anti-drop structure 67 of the first preferred embodiment is applicable to the second preferred embodiment or the third preferred embodiment.

Next, referring to FIG. 13 to FIG. 18, fourth to seventh preferred embodiments will be described. In the fourth to seventh preferred embodiments, a rotational operator (operator) 59 is used instead of the slide operator 57, to supply a driving force to the upper shelf 62. First, referring to FIG. 13 and FIG. 14, features shared by the fourth to seventh preferred embodiments will be described.

Figure 13:
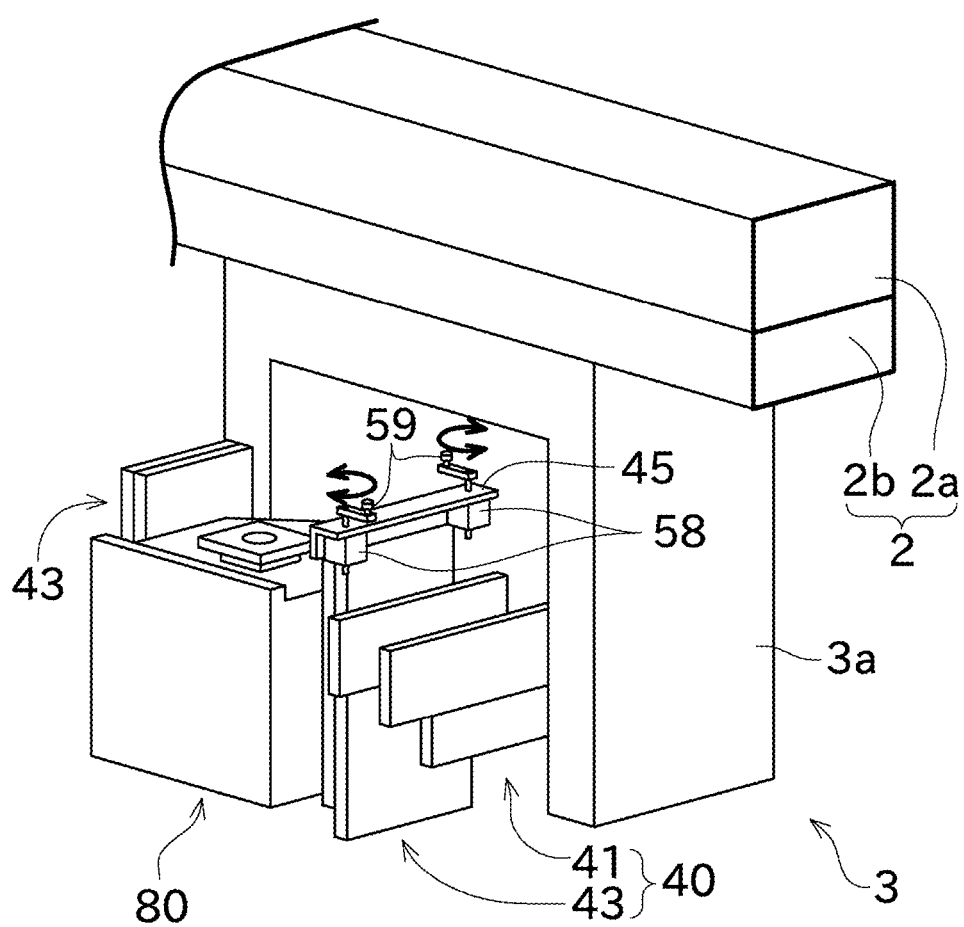
FIG. 13 is a perspective view showing an overhead transport vehicle according to any of fourth to seventh preferred embodiments of the present invention.

As shown in FIG. 13, an overhead transport vehicle 3 according to each of these preferred embodiments includes a motor mount 45 in addition to the opening/closing motor 58 and the rotational operator 59 described above. The motor mount 45 is attached to the upper shelf transfer device 40. The motor mount 45 is attached to a portion of the upper shelf transfer device 40, the portion being moved in the first movement involving lateral movement of the holding base 52 (FOUP 80) but being not moved in the second movement involving upward movement of the holding base 52. Accordingly, the rotational operator 59 moves in the lateral direction in the first movement. Although these preferred embodiments have the motor mount 45 attached at only one side with respect to the forward direction, it is acceptable that the motor mounts 45 are attached on both sides.

Mounted to the motor mount 45 are the opening/closing motor 58 and the rotational operator 59. Like the foregoing preferred embodiment, the opening/closing motor 58 generates a driving force to switch the state of the upper shelf 62 between the open state and the closed state. The opening/closing motor 58 is able to control the rotation direction and the amount of rotation. The rotational operator 59 is rotated with a driving force generated by the opening/closing motor 58. Similarly to the slide operator 57, the rotational operator 59 transmits the driving force to the upper shelf 62 side. The motor mount 45, the opening/closing motor 58, and the rotational operator 59 are provided at positions (for example, outside the upward slide mechanism 43) that avoid interference with the second movement of the upward slide mechanism 43.

In these preferred embodiments, two opening/closing motors 58 and two rotational operators 59 are provided side by side in a direction (left-right direction) perpendicular to both the forward direction and the up-down direction. The opening/closing motor 58 and the rotational operator 59 on one side in the left-right direction are used to transfer a FOUP 80 to the upper shelf 62 located on one side in the left-right direction, while the opening/closing motor 58 and the rotational operator 59 on the other side in the left-right direction are used to transfer a FOUP 80 to the upper shelf 62 located on the other side in the left-right direction. Instead, it is acceptable that an opening/closing motor 58 and a rotational operator 59 are commonly used in transfer of a FOUP 80 to either of the upper shelves 62 on one side and the other side in the left-right direction.

Figure 14:
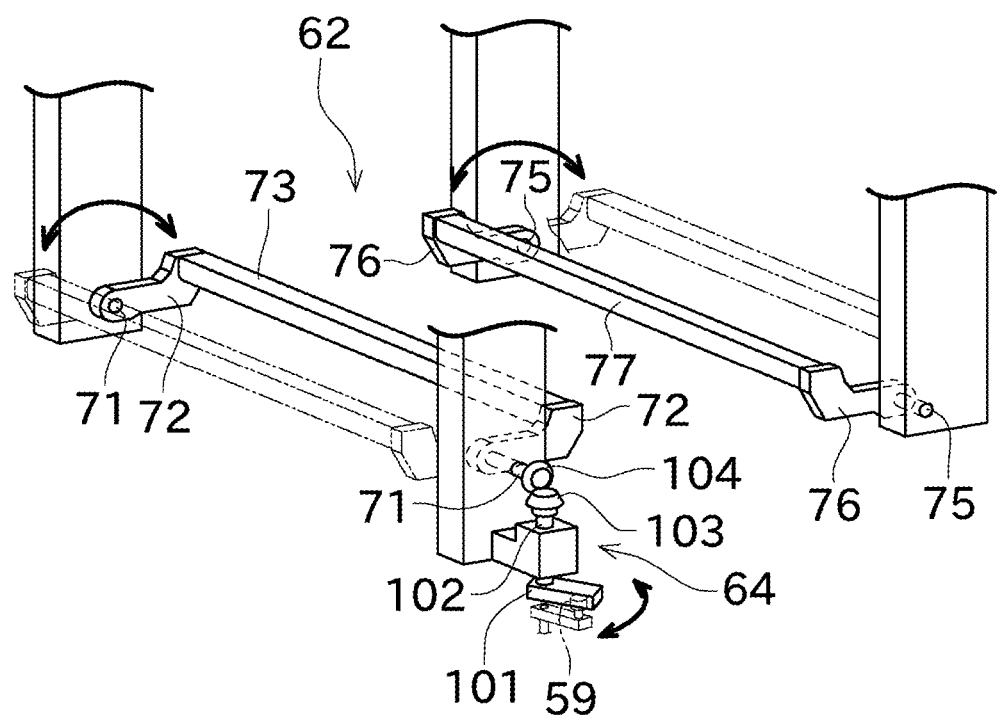
FIG. 14 is a perspective view showing an upper shelf according to any of the fourth to seventh preferred embodiments of the present invention.

As shown in FIG. 14, the upper shelf 62 includes a first shaft 71, a first arm 72, a first support portion 73, a second shaft 75, a second arm 76, and a second support portion 77.

The first shaft 71 is rotatably mounted to a fixed portion (an immovable portion, e.g., the side plate 61 in the foregoing preferred embodiment) of the upper shelf 62. The first arm 72 is able to rotate integrally with the first shaft 71 in the same direction as the first shaft 71. The first shaft 71 is fixed to one end portion of the first arm 72, while the first support portion 73 is fixed to the other end portion of the first arm 72. The first shaft 71 includes a pair of first shafts 71, and the first arm 72 includes a pair of first arms 72. The upper shelf 62 includes the first support portion 73, which connects the pair of first arms 72. The first support portion 73 is a portion that supports a FOUP 80. The first support portion 73 may be shaped like a rod or flat plate.

The second shaft 75, the second arm 76, and the second support portion 77 have features that are identical or symmetrical to the features of the first shaft 71, the first arm 72, and the first support portion 73. Thus, a FOUP 80 is supported by the first support portion 73 and the second support portion 77.

Accordingly, rotation of the first shafts 71 causes the first arms 72 and the first support portion 73 to rotate integrally. Rotation of the second shafts 75 causes the second arms 76 and the second support portion 77 to rotate integrally. Accordingly, the state of the upper shelf 62 is able to be switched between the closed state (solid lines) and the open state (chain lines).

Accordingly, a driving force received from the overhead transport vehicle 3 (a driving force received from the outside of the upper shelf 62) is used to rotate the first shafts 71 and the second shafts 75. To switch between the closed state and the open state, the first shafts 71 and the second shafts 75 may be rotated in different directions. Rotating the first shafts 71 and the second shafts 75 in the same direction causes, for example, the first support portion 73 to rotate upward while causing the second support portion 77 to rotate downward. In this case, a large space is occupied in the up-down direction. The first shafts 71 and the second shafts 75 are able to in the same direction, for example, to simplify the switching mechanism 64.

In these preferred embodiments, the driving force from the overhead transport vehicle 3 is transmitted to the first shaft 71 through a receiving portion 101, a receiving shaft 102, a first bevel gear 103, and a second bevel gear 104, which are included in the switching mechanism 64. The receiving portion 101 is rotatable about the receiving shaft 102 defining and functioning as the rotation axis. The receiving portion 101 is located at a position corresponding to a location of the rotational operator 59 after the first movement. Accordingly, the rotational operator 59 is rotated after the first movement, and the receiving portion 101 and the receiving shaft 102 are rotated in accordance with the rotation direction and the amount of rotation of the rotational operator 59.

The first bevel gear 103 is fixed to the receiving shaft 102. The second bevel gear 104 is fixed to the first shaft 71. The first bevel gear 103 and the second bevel gear 104 are meshed with each other. Accordingly, the driving force is able to transmit from the rotational operator 59 to the first shaft 71 through the first bevel gear 103, the second bevel gear 104, and the like. Changing the rotation direction of the opening/closing motor 58 is able to change the rotation direction of the first shaft 71. The transmission of the driving force using the receiving portion 101, the receiving shaft 102, the first bevel gear 103, and the second bevel gear 104 is just an example, and is able to be altered as appropriate.

In these preferred embodiments, the driving force used to rotate the first shafts 71 is further transmitted to the second shafts 75 by the switching mechanism 64, and the second shafts 75 are rotated in the direction reverse to the rotation direction of the first shafts 71. Thus, the first shafts 71 and the second shafts 75 are able to be driven to switch the state of the upper shelf 62 from the open state to the closed state by using the single driver. A specific structure of the switching mechanism 64 varies among the preferred embodiments.

In the fourth to sixth preferred embodiments, the state of the upper shelf 62 is able to be switched from the closed state to the open state by rotating the opening/closing motor 58 in the reverse direction, because it causes the first shafts 71 and the second shafts 75 to rotate in directions reverse to the directions in which they rotate to switch from the open state to the closed state. In the seventh preferred embodiment, instead of rotating the opening/closing motor 58 in the reverse direction, the other rotational operator 59 is used to rotate the second shafts 75, as will be described later. Only in the seventh preferred embodiment, features corresponding to the receiving portion 101, the receiving shaft 102, the first bevel gear 103, and the second bevel gear 104 are provided not only to the first shaft 71 but also to the second shaft 75.

Figure 15:
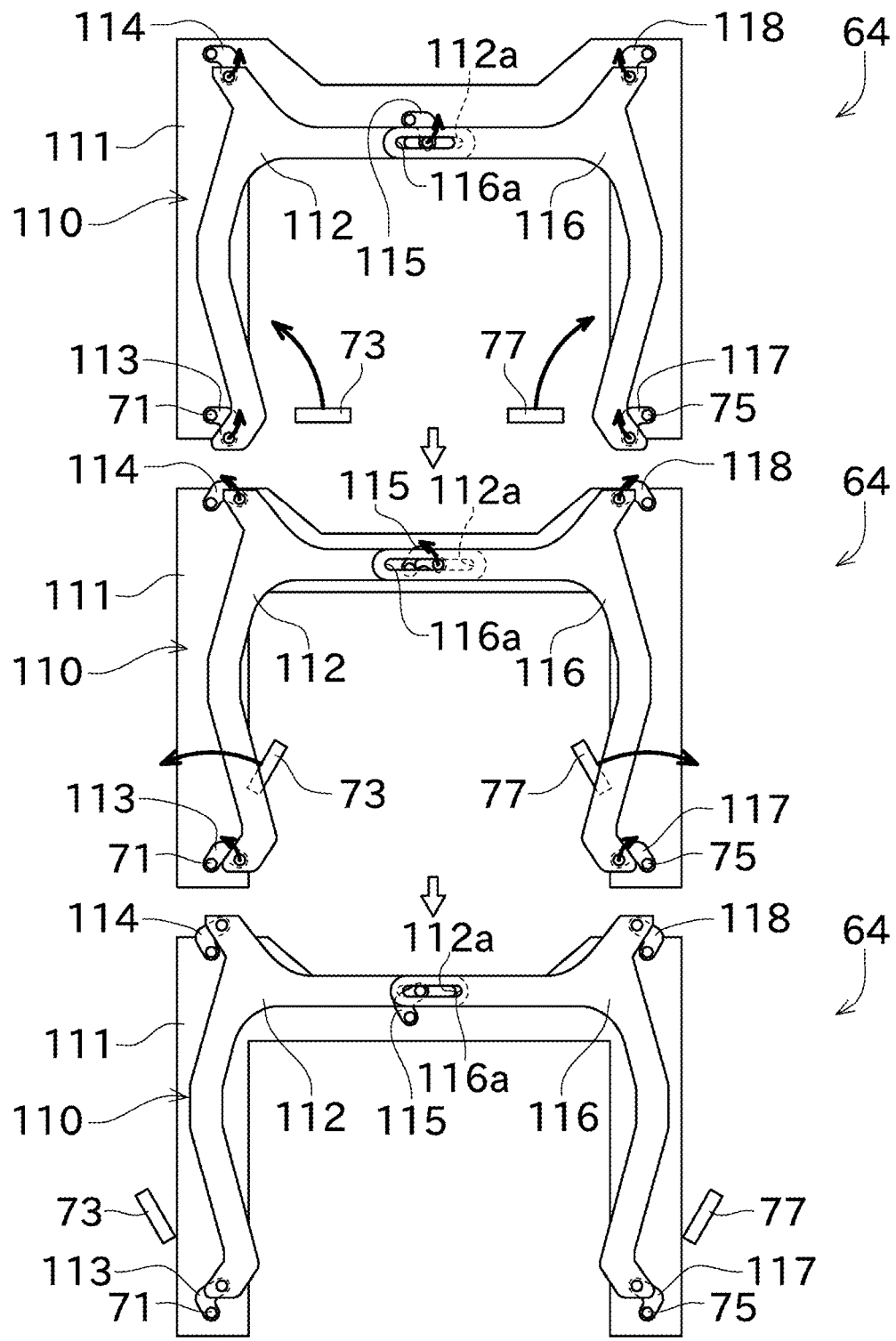
FIG. 15 is a front view showing how the upper shelf of the fourth preferred embodiment of the present invention switches from the closed state to the open state.

Next, referring to FIG. 15, the switching mechanism 64 of the fourth preferred embodiment will be described.

The switching mechanism 64 of the fourth preferred embodiment includes a link support portion 111 and a coupling link mechanism 110. The link support portion 111 supports the first shaft 71, the second shaft 75, the coupling link mechanism 110, and the like. The link support portion 111 is not moved in conjunction with the first shaft 71, the second shaft 75, the coupling link mechanism 110, and the like.

The coupling link mechanism 110 is a mechanism that couples the first shaft 71 to the second shaft 75. The coupling link mechanism 110 includes a first coupling link 112, a first shaft link 113, an auxiliary link 114, a common link 115, a second coupling link 116, a second shaft link 117, and an auxiliary link 118.

The first coupling link 112 is coupled to the first shaft link 113, the auxiliary link 114, and the common link 115. The first shaft link 113, which is fixed to the first shaft 71 via a through hole formed in the link support portion 111, rotates integrally with the first shaft 71. Thus, as the first shaft 71 is driven, the first coupling link 112 is moved. The auxiliary link 114 is attached to the link support portion 111. The common link 115 is inserted into an opening 112a in the shape of an elongated hole formed in the first coupling link 112. In this preferred embodiment, the first shaft link 113, the auxiliary link 114, and the common link 115 have equal turning radii. Thus, the first coupling link 112 moves without changing its direction (parallel-translation movement).

The second coupling link 116 is coupled to the second shaft link 117, the auxiliary link 118, and the common link 115. The second coupling link 116, the second shaft link 117, and the auxiliary link 118 are axially symmetrical to the first coupling link 112, the first shaft link 113, and the auxiliary link 114. The axis of the axial symmetry is a line that passes through the middle point of a line segment connecting the first shaft 71 to the second shaft 75 and that is perpendicular to the line segment. The common link 115 is inserted into an opening 116a of the second coupling link 116. The second coupling link 116 is operated by receiving a driving force via the common link 115. The auxiliary link 118 and the second shaft link 117 are rotated accordingly. Movements of the second coupling link 116, the second shaft link 117, and the auxiliary link 118 are axially symmetrical to movements of the first coupling link 112, the first shaft link 113, and the auxiliary link 114 with respect to the aforementioned axis. Therefore, the rotation direction of the first shaft 71 is different from the rotation direction of the second shaft 75.

A further description will be provided to a change of the rotation directions of the first shaft 71 and the second shaft 75 upon transmission of the driving force from the first shaft 71 to the second shaft 75. In the upper drawing in FIG. 15, a position where the first coupling link 112 is coupled to the first shaft link 113 is located lower than the first shaft 71 and more inward than the first shaft 71. Naturally, a position where the second coupling link 116 is coupled to the second shaft link 117 is located lower than the second shaft 75 and more inward than the second shaft 75. If an upward force acts on both the first shaft link 113 and the second shaft link 117, the first shaft link 113 and the second shaft link 117 rotate upward while passing through the inside (rotate in different directions).

Accordingly, with use of the coupling link mechanism 110, just rotating the first shaft 71 toward one side is able to rotate the second shaft 75 toward the other side. As a result, the first support portion 73 and the second support portion 77 are able to be rotated outward as shown in FIG. 15, and the state of the upper shelf 62 is able to be switched from the closed state to the open state. Likewise, by rotating the first shaft 71 in another direction, the state of the upper shelf 62 is able to be switched from the open state to the closed state.

The first coupling link 112 is a substantially L-shaped structure including a portion that retracts (extends) upward from its portion coupled to the first shaft link 113. The second coupling link 116 includes the same or similar features. Thus, in the coupling link mechanism 110, a space appears in a region around the line segment connecting the first shaft 71 to the second shaft 75. By this, interference of the upper shelf 62 with the overhead transport vehicle 3 is prevented. Features to provide upward retraction of the first coupling link 112 and the second coupling link 116 may not be necessary depend on the overhead transport vehicle 3.

After switching the state of the upper shelf 62, the rotational operator 59 is away from the upper shelf 62. The upper shelf 62, therefore, may be provided with a stopper or the like to maintain the current state (for maintaining the state until a force of a predetermined or more magnitude is applied).

Figure 16:
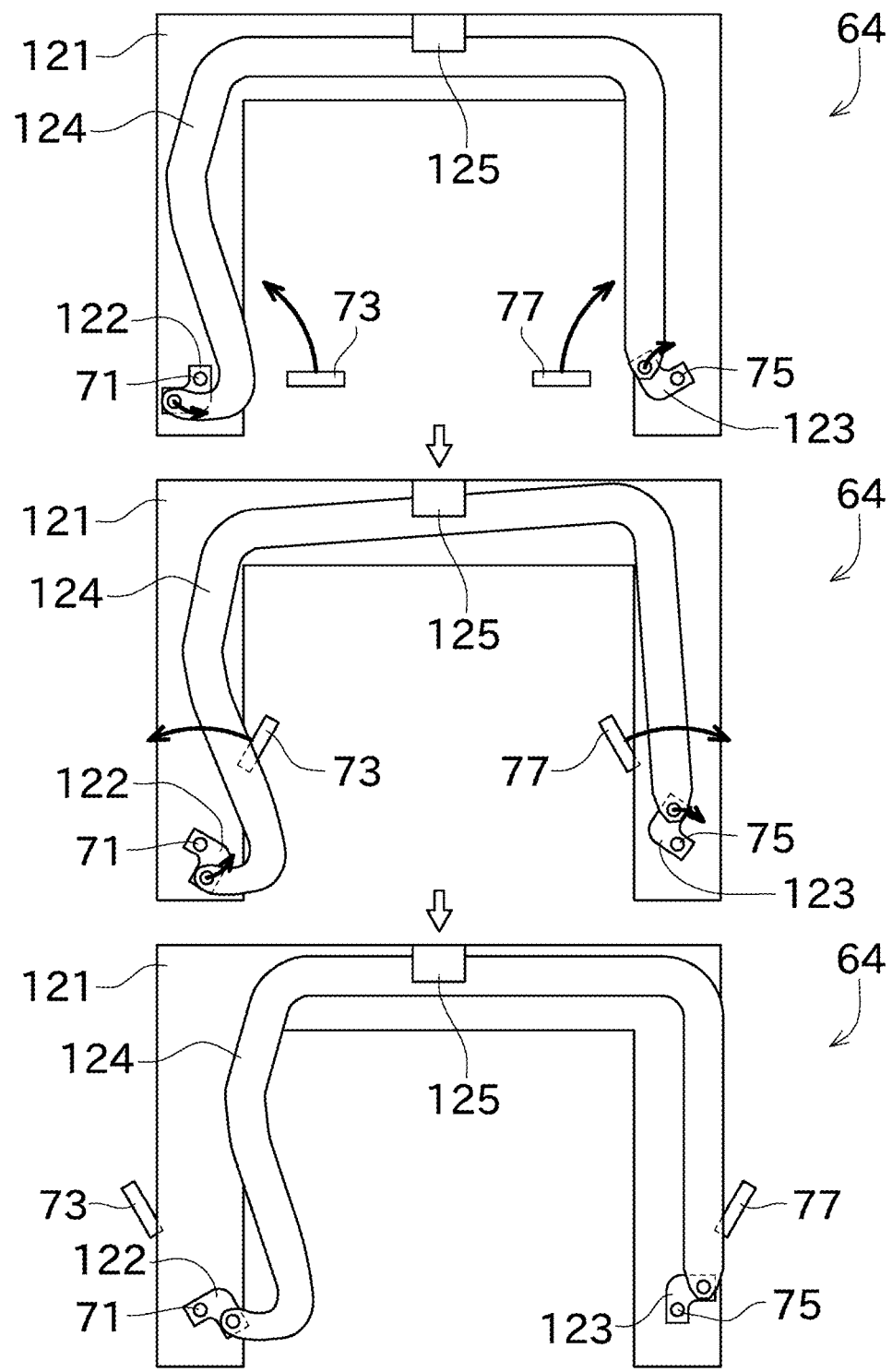
FIG. 16 is a front view showing how the upper shelf of the fifth preferred embodiment of the present invention switches from the closed state to the open state.

Next, referring to FIG. 16, the switching mechanism 64 of the fifth preferred embodiment will be described.

In the foregoing fourth preferred embodiment, the first shaft link 113 and the second shaft link 117 are coupled via two links (the first coupling link 112 and the second coupling link 116). In the fifth preferred embodiment, a first shaft link 122 and a second shaft link 123 are coupled via a single link (coupling link 124). The features of the first shaft link 122 and the second shaft link 123 are identical or similar to the features of the fourth preferred embodiment.

A portion of the coupling link 124 on the first shaft 71 side is rotatably coupled to the first shaft link 122, and a portion thereof on the second shaft 75 side is rotatably coupled to the second shaft link 123. The coupling link 124 is able to retract upward, similar to the fourth preferred embodiment. The coupling link 124 is supported by a link support portion 121 via the first shaft link 122 and the second shaft link 123, similarly to the fourth preferred embodiment. Fixed to the link support portion 121 is a stopping plate 125 to prevent the coupling link 124 from shaking in the axial direction of the first shaft 71, etc. The stopping plate 125 normally does not cramp the coupling link 124. Only when the coupling link 124 largely moves in the axial direction of the first shaft 71, etc., the stopping plate 125 comes into contact with the coupling link 124 to prevent more movement.

As the first shaft 71 is rotated, the first shaft link 122 is integrally rotated in the same direction. As the first shaft link 122 is rotated, the coupling link 124 operates and the second shaft link 123 is rotated. Consequently, the second shaft 75 is rotated in the direction reverse to the rotation direction of the first shaft 71.

Depending on the shape and coupling position of the coupling link 124, the first shaft 71 and the second shaft 75 may be rotated in the same direction. In this preferred embodiment, however, the second shaft 75 receives a driving force from the first shaft 71, to thereby be rotated in the direction reverse to the rotation direction of the first shaft 71. For example, in the upper drawing in FIG. 16, rotation of the first shaft 71 causes a coupling portion between the first shaft link 122 and the coupling link 124 to be rotated toward the inside while passing through the lower side of the first shaft 71. This driving force is transmitted to the second shaft link 123 via the coupling link 124. A coupling portion between the second shaft link 123 and the coupling link 124 is located above the second shaft 75, and therefore is rotated toward the outside while passing through the upper side of the second shaft 75. Consequently, the first shaft 71 and the second shaft 75 are rotated in different directions.

As thus far described, with use of the coupling link 124, etc., just rotating the first shaft 71 toward one side is able to rotate the second shaft 75 toward the other side. As a result, the first support portion 73 and the second support portion 77 are able to be rotated outward as shown in FIG. 16, and the state of the upper shelf 62 is able to be switched from the closed state to the open state. Likewise, by rotating the first shaft 71 in another direction, the state of the upper shelf 62 is able to be switched from the open state to the closed state.

Figure 17:
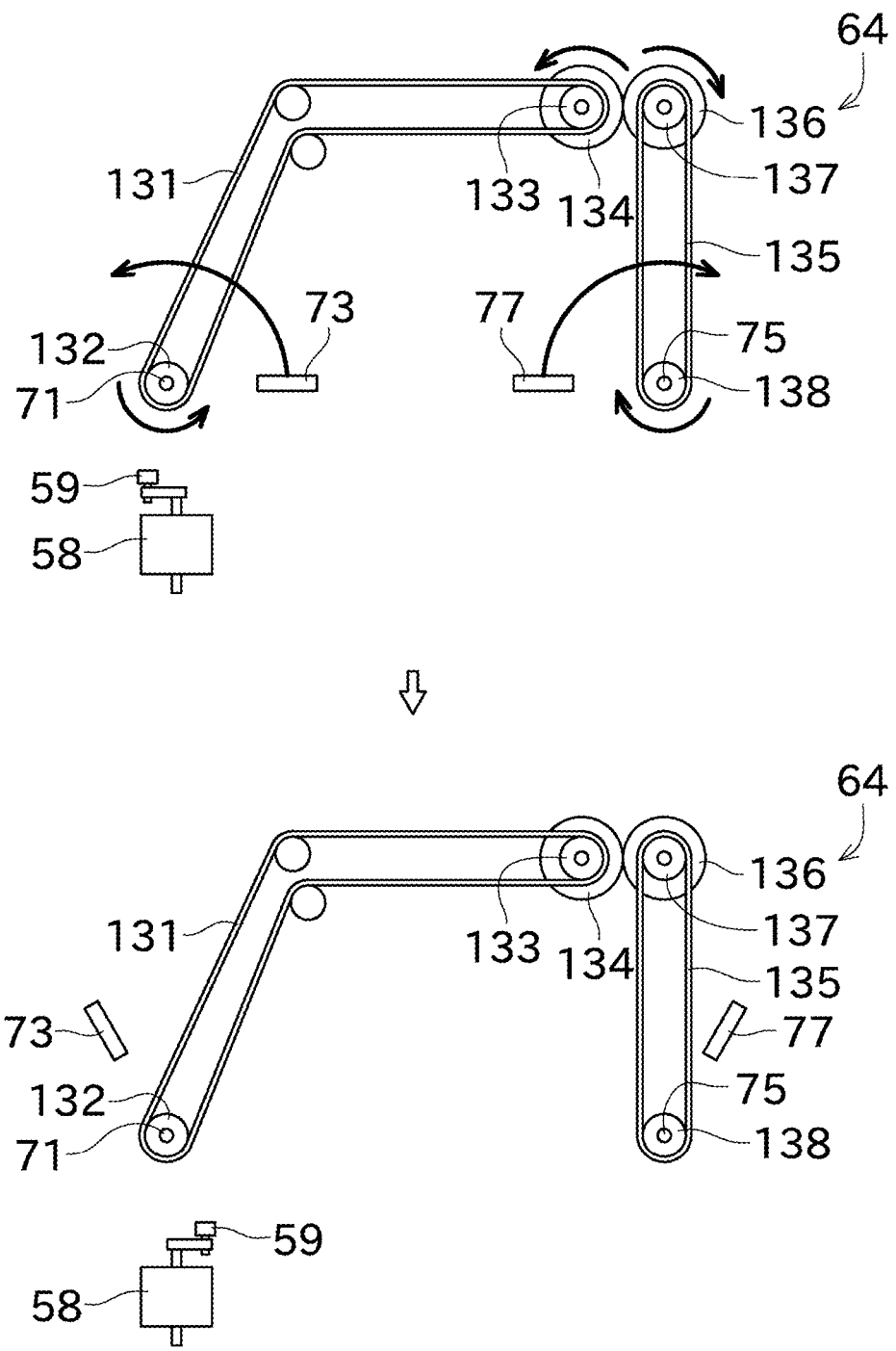
FIG. 17 is a front view showing how the upper shelf of the sixth preferred embodiment of the present invention switches from the closed state to the open state.

Next, referring to FIG. 17, the switching mechanism 64 of the sixth preferred embodiment will be described.

In the sixth preferred embodiment, a structure including belts and pulleys is used to transmit a driving force from the first shaft 71 to the second shaft 75. To be specific, the switching mechanism 64 of the sixth preferred embodiment includes a first belt 131 and a second belt 135.

The first belt 131 is wound around a drive pulley 132 and a first pulley 133. The drive pulley 132, which is fixed to the first shaft 71, rotates integrally with the first shaft 71. Rotation of the first shaft 71 defines and functions as a driving force to move the first belt 131. The first pulley 133 is located at a position between the first shaft 71 and the second shaft 75, the position being located higher than the first shaft 71 and the second shaft 75. The switching mechanism 64 is able to partially retract upward, similarly to the fourth and fifth preferred embodiments. The switching mechanism 64 also includes a first gear 134, which rotates integrally with the first pulley 133. Thus, rotation of the first shaft 71 causes rotation of the first gear 134.

The first gear 134 is meshed with a second gear 136 provided near the first gear 134. Accordingly, the second gear 136 is rotated in the direction reverse to the rotation direction of the first gear 134. The switching mechanism 64 also includes a second pulley 137, which rotates integrally with the second gear 136. The second belt 135 is wound around the second pulley 137 and a driven pulley 138. The driven pulley 138, which is fixed to the second shaft 75, rotates integrally with the second shaft 75.

Accordingly, rotation of the second shaft 75 is able to be caused by rotation of the first shaft 71. Since the first gear 134 and the second gear 136 are provided midway, the rotation direction of the second shaft 75 is reverse to that of the first shaft 71. As a result, the first support portion 73 and the second support portion 77 are able to be rotated outward as shown in FIG. 17, and the state of the upper shelf 62 is able to be switched from the closed state to the open state. Likewise, by rotating the first shaft 71 in another direction, the state of the upper shelf 62 is able to be switched from the open state to the closed state.

In the sixth preferred embodiment, the first gear 134 and the second gear 136 are directly meshed with each other; however, they may be meshed with each other via an even number of gears.

Figure 18:
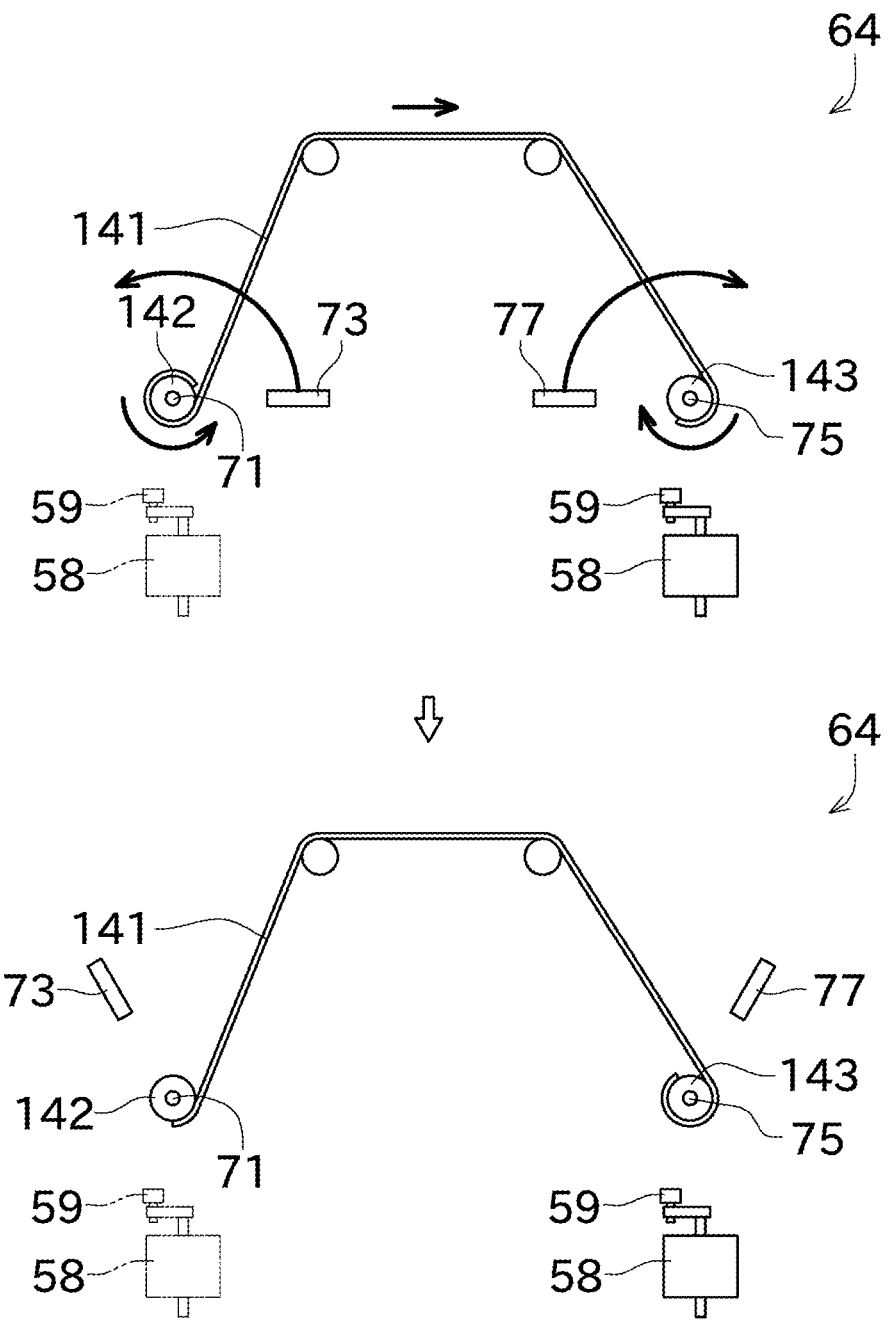
FIG. 18 is a front view showing how the upper shelf of the seventh preferred embodiment of the present invention switches from the closed state to the open state.

Next, referring to FIG. 18, the switching mechanism 64 of the seventh preferred embodiment will be described.

The switching mechanism 64 of the seventh preferred embodiment transmits a driving force by using rotation of a reel retrieving a belt. Specifically, the switching mechanism 64 includes a coupling belt 141, a first reel 142, and a second reel 143.

According to the structure of the first reel 142, the coupling belt 141 is able to be wound thereon. The first reel 142, which is fixed to the first shaft 71, rotates integrally with the first shaft 71. Accordingly, rotating the first shaft 71 in a first direction by using the rotational operator 59 is able to wind the coupling belt 141.

The coupling belt 141 retracts upward from the first reel 142, and then is wound on the second reel 143. The switching mechanism 64 is able to partially retract upward, similar to the fourth to sixth preferred embodiments.

According to the structure of the second reel 143, the coupling belt 141 is able to be wound thereon. The second reel 143, which is fixed to the second shaft 75, rotates integrally with the second shaft 75. As shown in FIG. 18, a direction in which the coupling belt 141 is wound on the first reel 142 and a direction in which the coupling belt 141 is wound on the second reel 143 are the same. Accordingly, a rotation direction of the first reel 142 when the coupling belt 141 is wound is different from a rotation direction of the second reel 143 when the coupling belt 141 is pulled out.

As the first shaft 71 is rotated in the first direction, and the first reel 142 winds the coupling belt 141 as described above, the second reel 143 is rotated in a direction to pull out the coupling belt 141. In other words, the first shaft 71 and the second shaft 75 are rotated in different directions.

On the other hand, rotating the first shaft 71 in a second direction (the direction reverse to the first direction) does not always cause the coupling belt 141 to be wound onto the second reel 143. A driving force of the first shaft 71 is not transmitted to the second shaft 75. In the seventh preferred embodiment, therefore, not only the rotational operator 59 to drive the first shaft 71 but also a rotational operator 59 to drive the second shaft 75 is provided. In addition, provided between the rotational operator 59 and the second shaft 75 are a receiving portion 101, a receiving shaft 102, a first bevel gear 103, a second bevel gear 104, and the like, as described above.

Accordingly, the second shaft 75, in addition to the first shaft 71, is able to be driven into rotation. As shown in FIG. 18, as the rotational operator 59 rotates the second shaft 75 and the second reel 143 is rotated in a direction wind the coupling belt 141, the coupling belt 141 is pulled out from the first reel 142. The coupling belt 141 is able to be rotated accordingly. In this case as well, the first shaft 71 and the second shaft 75 are rotated in different directions. As a result, the first support portion 73 and the second support portion 77 are able to be rotated outward, and the state of the upper shelf 62 is able to be switched from the closed state to the open state. As the rotational operator 59 rotates the first shaft 71 and the first reel 142 is rotated in a direction to wind the coupling belt 141, the state of the upper shelf 62 is able to be switched from the open state to the closed state.

As thus far described, the ceiling suspended shelf 6 is a shelf where the overhead transport vehicle 3 temporarily places a FOUP 80 in transporting the FOUP 80 to the target position (load port 5), the overhead transport vehicle 3 transporting the FOUP 80 by traveling along the rail 2 while being suspended, the rail being provided on the ceiling 7 of the building. The ceiling suspended shelf 6 is suspended from the ceiling 7. The ceiling suspended shelf 6 includes the upper shelf 62 including the upper support surface 62a to support the FOUP 80. The level of the upper support surface 62a is substantially the same as the level of the rail 2.

Accordingly, the FOUP 80 is able to be placed at a high position in a space that has conventionally not been available to place a FOUP 80, thus achieving more effective use of a space in the building.

In the foregoing preferred embodiments, the ceiling suspended shelf 6 includes the switching mechanism 64 to switch the state of the upper shelf 62 between the open state that allows the FOUP 80 to pass from below to above the upper shelf 62, and the closed state that allows the upper shelf 62 to support the FOUP 80 and does not allow the FOUP 80 to pass from below to above the upper shelf 62.

Accordingly, an operation to place the FOUP 80 in the upper shelf 62, which locates the FOUP 80 at a high position, is able to be implemented from below. Thus, the operation to place the FOUP 80 is able to be simple.

In the foregoing preferred embodiments, the switching mechanism 64 of the ceiling suspended shelf 6 switches between the open state and the closed state by using a driving force received from outside (from the overhead transport vehicle 3).

In the fourth to seventh preferred embodiments, the upper shelf 62 of the ceiling suspended shelf 6 includes the first shaft 71, the first support portion 73, the second shaft 75, and the second support portion 77. The first shaft 71 is able to rotate. The first support portion 73 rotates integrally with the first shaft 71. The second shaft 75 is able to rotate, and its axial center is different to that of the first shaft 71. The second support portion 77 rotates integrally with the second shaft 75. The switching mechanism 64 switches between the open state and the closed state by transmitting to the first shaft 71 an external driving force as a rotational force while transmitting to the second shaft 75 an external driving force as a rotational force in the direction reverse to the rotational force transmitted to the first shaft 71.

Accordingly, it is not necessary to independently drive the first shaft 71 and the second shaft 75, which simplifies a drive system. If the first shaft 71 and the second shaft 75 were rotated in the same direction, the first support portion 73 would be rotated upward while the second support portion 77 would be rotated downward, resulting in a larger space occupied in the up-down direction. In this respect, rotating the first shaft 71 and the second shaft 75 in different directions causes the first support portion 73 and the second support portion 77 to move up or down in the same direction, which contributes to a reduction of an occupied space in the up-down direction.

In the fourth preferred embodiment, the switching mechanism 64 of the ceiling suspended shelf 6 includes the coupling link mechanism 110 that couples the first shaft 71 to the second shaft 75. The coupling link mechanism 110 includes the first coupling link 112 and the second coupling link 116. The first coupling link 112 is positioned on the side close to the first shaft 71. The second coupling link 116 is positioned on the side close to the second shaft 75, is coupled to the first coupling link 112, and rotates in the direction reverse to the rotation direction of the first coupling link 112.

Accordingly, by using the links, the first shaft 71 and the second shaft 75 are able to be rotated in different directions.

In the fifth preferred embodiment, the switching mechanism 64 of the ceiling suspended shelf 6 includes the first shaft link 122, the second shaft link 123, and the coupling link 124. The first shaft link 122 rotates integrally with the first shaft link 122. The second shaft link 123 rotates integrally with the second shaft 75. The coupling link 124 couples the first shaft link 122 to the second shaft link 123 and the first shaft link 122 and the second shaft link 123 rotate in different directions.

Accordingly, by mainly using the single coupling link 124, the first shaft link 122 and the second shaft link 123 are able to be rotated in different directions, thus providing a simple mechanism.

In the sixth preferred embodiment, the switching mechanism 64 of the ceiling suspended shelf 6 includes the first pulley 133, the first belt 131, the first gear 134, the second gear 136, the second pulley 137, and the second belt 135. The first belt 131 is wound around the first pulley 133, and rotates the first shaft 71. The first gear 134 rotates integrally with the first pulley 133 in the same direction as the first pulley 133. The second gear 136 is meshed with the first gear 134, to thereby be rotated in the direction reverse to the rotation direction of the first gear 134. The second pulley 137 rotates integrally with the second gear 136 in the same direction as the second gear 136. The second belt 135 is wound around the second pulley 137, and rotates the second shaft 75.

Accordingly, by using the belts and pulleys, the first shaft 71 and the second shaft 75 are able to be rotated in different directions.

In the seventh preferred embodiment, the switching mechanism 64 of the ceiling suspended shelf 6 includes the coupling belt 141, the first reel 142, and the second reel 143. The first reel 142 rotates integrally with the first shaft 71, and has the coupling belt 141 wound thereon. The second reel 143 rotates integrally with the second shaft 75, and has the coupling belt 141 wound thereon in the same winding direction as on the first reel 142. As the first reel 142 is rotated by the external driving force and the coupling belt 141 is wound onto the first reel, the second reel 143 is rotated in the direction reverse to the rotation direction of the first reel 142. As the second reel 143 is rotated by the external driving force and the coupling belt 141 is wound onto the second reel 143, the first reel 142 is rotated in the direction reverse to the rotation direction of the second reel 143.

Therefore, the belt may not be looped. Accordingly, a short belt is able to be used to rotate the first shaft and the second shaft in different directions.

Thus, the cost of the ceiling suspended shelf 6 is able to be reduced, as compared to a structure including a drive source provided to each ceiling suspended shelf 6.

In the foregoing preferred embodiments, the ceiling suspended shelf 6 includes not only the upper shelf 62 but also the lower shelf 65, which overlaps the upper shelf 62 in a plan view. The lower shelf 65 is located lower than the upper shelf 62. The lower shelf 65 does not allow a FOUP 80 to pass therethrough in the up-down direction.

Since the shelves are able to be provided one above the other, the space in the building is able to be used more effectively.

In the foregoing preferred embodiments, according to the structure of the ceiling suspended shelf 6, the number of FOUPs 80 that are able to be placed in one compartment is smaller in the upper shelf 62 than in the lower shelf 65.

Accordingly, FOUPs 80 are able to be placed efficiently based on, for example, a difference in how each FOUP 80 is transported.

In the ceiling suspended shelf 6 of the foregoing preferred embodiments, the FOUP 80 is a wafer transport container to transport wafers. The upper shelf 62 has, on its upper support surface 62a, the insertion pins 62b that are to be received in the recess 81a formed in the bottom surface 81 of the FOUP 80.

Accordingly, the presence of the insertion pins 62b in the upper shelf 62 is able to stabilize the posture of the FOUP 80.

In the ceiling suspended shelf 6 of the foregoing preferred embodiments, the target position is a position (load port 5) where the FOUP 80 is placed toward the processing apparatus 4 that is a wafer processor. The upper shelf 62 is located at a position higher than the target position.

Accordingly, a space located higher than the load port 5 is able to be used effectively.

In the foregoing preferred embodiments, according to the structure of the ceiling suspended shelf 6, the upper shelves 62 are provided on opposite sides across the rail 2.

Accordingly, the space in the building is able to be used further effectively.

In the foregoing preferred embodiments, the ceiling suspended shelf 6 includes the upper side surface guide 63, which faces the side surface 83 of the FOUP 80 supported by the upper shelf 62. The upper side surface guide 63 is located at a position higher than the lower end of the rail 2.

Accordingly, the upper shelf 62 is able to be provided at a relatively high position.

In the preferred embodiments, the ceiling suspended shelf 6 has, on its back side, the anti-drop structure 67 to prevent the FOUP 80 from dropping, where the back side is the side opposite to the front side facing the rail 2.

Accordingly, dropping of the FOUP 80 is able to be prevented more reliably when, for example, the FOUP 80 is transferred to the ceiling suspended shelf 6.

While some preferred embodiments of the present invention have been described above, the features and structures described above may be modified, for example, as follows.

Although in the foregoing preferred embodiments, the ceiling suspended shelf 6 includes the upper shelf 62 and the lower shelf 65, only the upper shelf 62 may be included. Although in the foregoing preferred embodiments, two FOUPs 80 are able to be placed in one compartment of the upper shelf 62 while three FOUPs 80 are able to be placed in one compartment of the lower shelf 65, the number of FOUPs 80 that are able to be placed may be changed. The number of FOUPs 80 that are able to be placed in the upper shelf 62 may be equal to the number of FOUPs 80 that are able to be placed in the lower shelf 65. Alternatively, the number of FOUPs 80 that are able to be placed may be larger in the upper shelf 62.

In the foregoing preferred embodiments, the upper shelf transfer device 40 transfers the FOUP 80 to the upper shelf 62 through the first movement involving lateral movement and the second movement involving upward movement. The FOUP 80, however, may be moved in a different way. For example, the first movement may be preceded by slight downward movement to separate the FOUP 80 from the overhead transport vehicle 3.

At least either the chuck 51 or the holding base 52 may hold a side surface (including a protruding portion, etc., provided on the side surface) of the FOUP 80.

The slide operator 57 of the first preferred embodiment provides a driving force resulting from linear motion to the switching mechanism 64, while the rotational operator 59 of the fourth to seventh preferred embodiments provides a driving force resulting from rotational motion to the switching mechanism 64. In both of these cases, the driving force supply is implemented by contacting. Instead, the operator may contactlessly supply the driving force by, for example, a magnet gear.

Although the foregoing preferred embodiments are described with respect to a non-limiting example of a transport system 1 that is installed in a factory to manufacture semiconductor products, this transport system 1 is able to be installed in a factory to manufacture other products, too. This transport system 1 is able to be installed in a building (e.g., a warehouse) other than manufacturing factories.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

The invention claimed is:

1. A ceiling suspended shelf where an overhead transport vehicle temporarily places articles while transporting the articles to a target position, the overhead transport vehicle transporting the articles by traveling along a rail while being suspended, the rail being provided on a ceiling of a building, the ceiling suspended shelf being suspended from the ceiling, the ceiling suspended shelf comprising:
　　an upper shelf including an upper support surface that supports the articles; wherein
　　a level of the upper support surface is the same or substantially the same as a level of the rail; and
　　the upper shelf includes a switching mechanism to switch a state of the upper shelf between an open state that allows the articles to pass from below to above the upper shelf and a closed state that allows the upper shelf to support the articles and does not allow the articles to pass from below to above the upper shelf.

2. The ceiling suspended shelf according to claim 1, wherein the switching mechanism is able to switch between the open state and the closed state in response to receiving an external driving force.

3. The ceiling suspended shelf according to claim 2, wherein
　　the upper shelf includes:
　　　　a first shaft that is able to rotate;
　　　　a first support portion to rotate integrally with the first shaft;
　　　　a second shaft that is able to rotate, and that has an axial center different to an axial center of the first shaft; and
　　　　a second support portion to rotate integrally with the second shaft, and
　　the switching mechanism is able to switch between the open state and the closed state by transmitting to the first shaft an external driving force as a rotational force while transmitting to the second shaft an external driving force as a rotational force in the direction reverse to the rotational force transmitted to the first shaft.

4. The ceiling suspended shelf according to claim 3, wherein
the switching mechanism includes a coupling link mechanism that couples the first shaft to the second shaft, and the coupling link mechanism includes:
- a first coupling link that is positioned on a side closest to the first shaft; and
- a second coupling link that is positioned on a side closest to the second shaft, is coupled to the first coupling link, and is rotatable in the direction reverse to a rotation direction of the first coupling link.

5. The ceiling suspended shelf according to claim 3, wherein
the switching mechanism includes:
- a first shaft link that is rotatable integrally with the first shaft;
- a second shaft link that is rotatable integrally with the second shaft; and
- a coupling link that couples the first shaft link to the second shaft link such that the first shaft link and the second shaft link are rotatable in different directions.

6. The ceiling suspended shelf according to claim 3, wherein
the switching mechanism includes:
- a first pulley;
- a first belt that is wound around the first pulley to rotate the first shaft;
- a first gear that is rotatable integrally with the first pulley in the same direction as the first pulley;
- a second gear that is meshed with the first gear directly or via an even number of gears, to be rotated in the direction reverse to a rotation direction of the first gear;
- a second pulley that is rotatable integrally with the second gear in the same direction as the second gear; and
- a second belt that is wound around the second pulley to rotate the second shaft.

7. The ceiling suspended shelf according to claim 3, wherein
the switching mechanism includes:
- a coupling belt;
- a first reel that is rotatable integrally with the first shaft, the first reel including the coupling belt wound thereon; and
- a second reel that is rotatable integrally with the second shaft, the second reel including the coupling belt wound thereon in the same winding direction as on the first reel;
- as the first reel is rotated by an external driving force and the coupling belt is wound onto the first reel, the second reel is rotated in the direction reverse to a rotation direction of the first reel; and
- as the second reel is rotated by an external driving force and the coupling belt is wound onto the second reel, the first reel is rotated in the direction reverse to a rotation direction of the second reel.

8. The ceiling suspended shelf according to claim 1, further comprising:
a lower shelf overlapping the upper shelf in a plan view; wherein
the lower shelf is lower than the upper shelf; and
the lower shelf does not allow the articles to pass therethrough in an up-down direction.

9. The ceiling suspended shelf according to claim 8, wherein a number of the articles that are able to be placed in one compartment is smaller in the upper shelf than in the lower shelf.

10. The ceiling suspended shelf according to claim 1, wherein
the article is a wafer transport container to transport wafers; and
the upper shelf includes, on the upper support surface, an insertion pin that is able to be received in a recess in a bottom surface of the wafer transport container.

11. The ceiling suspended shelf according to claim 10, wherein
the target position is a position where the wafer transport container is placed toward a processing apparatus to process the wafers; and
the upper shelf is located at a position higher than the target position.

12. The ceiling suspended shelf according to claim 1, wherein the upper shelf includes upper shelves that are provided on opposite sides across the rail.

13. The ceiling suspended shelf according to claim 1, further comprising:
an upper side surface guide that faces a side surface of the article supported by the upper shelf; wherein
the upper side surface guide is located at a position higher than the lower end of the rail.

14. The ceiling suspended shelf according to claim 1, wherein
the ceiling suspended shelf includes, on a back side of the ceiling suspended shelf, an anti-drop structure that prevents the articles from dropping, and
the back side is a side opposite to a front side facing the rail.

* * * * *